US012707639B2

(12) United States Patent
Lee

(10) Patent No.: US 12,707,639 B2
(45) Date of Patent: Aug. 11, 2026

(54) SEMICONDUCTOR MEMORY DEVICE

(71) Applicant: SK hynix Inc., Icheon-si (KR)

(72) Inventor: Nam Jae Lee, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 342 days.

(21) Appl. No.: 18/392,694

(22) Filed: Dec. 21, 2023

(65) Prior Publication Data

US 2025/0031370 A1 Jan. 23, 2025

(30) Foreign Application Priority Data

Jul. 20, 2023 (KR) ........................ 10-2023-0094774

(51) Int. Cl.

| | |
|---|---|
| ***H10B 43/27*** | (2023.01) |
| ***H10B 41/27*** | (2023.01) |
| ***H10B 80/00*** | (2023.01) |
| ***H10W 90/00*** | (2026.01) |
| *H10W 80/00* | (2026.01) |

(52) U.S. Cl.

CPC ............. *H10B 43/27* (2023.02); *H10B 41/27* (2023.02); *H10B 80/00* (2023.02); *H10W 90/00* (2026.01); *H10W 80/312* (2026.01); *H10W 80/327* (2026.01); *H10W 90/792* (2026.01)

(58) Field of Classification Search

CPC ........ H10B 43/27; H10B 41/27; H10B 80/00; H10B 43/10; H10B 43/40; H10B 43/50; H10B 43/35; H10B 43/20; H10B 51/20; H10B 51/30; H10B 51/40; H10B 63/10; H10B 63/30; H10W 90/00; H10W 80/312; H10W 80/327; H10W 90/792

See application file for complete search history.

(56) References Cited

U.S. PATENT DOCUMENTS

| | | | | |
|---|---|---|---|---|
| 11,925,018 B2 * | 3/2024 | Lee | ........................ | H10B 41/35 |
| 2022/0077182 A1 | 3/2022 | Lee | | |
| 2022/0139939 A1 | 5/2022 | Lee | | |

FOREIGN PATENT DOCUMENTS

| | | |
|---|---|---|
| KR | 101567024 B1 | 11/2015 |
| KR | 1020200068847 A | 12/2021 |
| KR | 1020210152147 A | 12/2021 |
| KR | 1020220060382 A | 5/2022 |

* cited by examiner

*Primary Examiner* — David Vu

(74) *Attorney, Agent, or Firm* — WILLIAM PARK AND ASSOCIATES LTD.

(57) ABSTRACT

A semiconductor memory device, and a method of manufacturing the semiconductor memory device, includes a gate stack, a pass gate overlapping a contact region of the gate stack and opening a cell array region of the gate stack, a doped semiconductor layer spaced apart from the pass gate and overlapping the cell array region of the gate stack, and an active pillar passing through the pass gate.

19 Claims, 31 Drawing Sheets

SEMICONDUCTOR MEMORY DEVICE

CROSS-REFERENCE TO RELATED APPLICATION

The present application claims priority under 35 U.S.C. § 119 (a) to Korean patent application number 10-2023-0094774 filed on Jul. 20, 2023, in the Korean Intellectual Property Office, the entire disclosure of which is incorporated by reference herein.

BACKGROUND

1. Technical Field

The present disclosure relates to a semiconductor memory device and a method of manufacturing the semiconductor memory device, and more particularly, to a three-dimensional semiconductor memory device and a method of manufacturing the three-dimensional semiconductor memory device.

2. Related Art

Semiconductor memory devices are applied to electronic devices of various fields, such as automobiles, medical care, and data centers, as well as small electronic devices. Accordingly, demand for semiconductor memory devices is increasing.

A semiconductor memory device may include a memory cell for data storage. To increase capacity of the semiconductor memory device, technology development for three-dimensional semiconductor memory devices including memory cells arranged in three dimensions is being actively researched.

SUMMARY

According to an embodiment of the present disclosure, a semiconductor memory device may include: a gate stack including a plurality of conductive patterns spaced apart from each other in a first direction and stacked in the first direction, the gate stack including a contact region and a cell array region extending from the contact region in a second direction crossing the first direction; a pass gate overlapping the contact region of the gate stack and opening the cell array region of the gate stack; a doped semiconductor layer spaced apart from the pass gate in the second direction and overlapping the cell array region of the gate stack; and a plurality of active pillars passing through the pass gate.

According to an embodiment of the present disclosure, a semiconductor memory device may include: a peripheral circuit structure including a first region and a second region; a pass gate spaced apart from the peripheral circuit structure in a first direction and overlapping the first region of the peripheral circuit structure; a doped semiconductor layer spaced apart from the peripheral circuit structure in the first direction and spaced apart from the pass gate in a second direction crossing the first direction; a gate stack including a contact region between the peripheral circuit structure and the pass gate and a cell array region extending from the contact region to a region between the peripheral circuit structure and the doped semiconductor layer; an active pillar passing through the pass gate; a pass gate insulating layer between the pass gate and the active pillar; a channel pillar contacting the doped semiconductor layer and passing through the cell array region of the gate stack; a memory layer between the channel pillar and the gate stack; and a gate contact plug connected to the active pillar and passing through the contact region of the gate stack.

According to an embodiment of the present disclosure, a method of manufacturing a semiconductor memory device may include: forming an active pillar surrounded by a pass gate insulating layer in a preliminary pass gate layer, wherein the preliminary pass gate layer includes the first region and a second region, and wherein the active pillar is formed in the first region of the preliminary pass gate layer; forming a memory cell array over the preliminary pass gate layer including the active pillar; forming a first conductive bonding pattern over the memory cell array; forming a structure including a peripheral circuit structure and a second conductive bonding pattern; performing a bonding process so that the first conductive bonding pattern and the second conductive bonding pattern are connected; etching the second region of the preliminary pass gate layer so that the first region of the preliminary pass gate layer remains as a pass gate surrounding the active pillar; and forming a doped semiconductor layer in a region where the second region of the preliminary pass gate layer is etched.

DETAILED DESCRIPTION

The specific structural and functional descriptions disclosed herein are merely illustrative for the purpose of describing embodiments according to the concept of the present disclosure. The embodiments according to the concept of the present disclosure can be modified in various forms and replaced with other equivalent embodiments. Thus the present disclosure should not be construed as limited to the embodiments set forth herein.

It will be understood that, although the terms “first,” “second,” etc. may be used herein to describe various elements, these elements should not be limited by these terms. These terms are only used to distinguish one element from another element, and the order or number of components is not limited by the terms. In addition, it is not construed as limiting the number of components unless there is a special limitation on components expressed in singular or plural numbers.

Embodiments of the present disclosure may provide a semiconductor memory device and a method of manufacturing the same capable of improving an integration degree.

Figure 1:
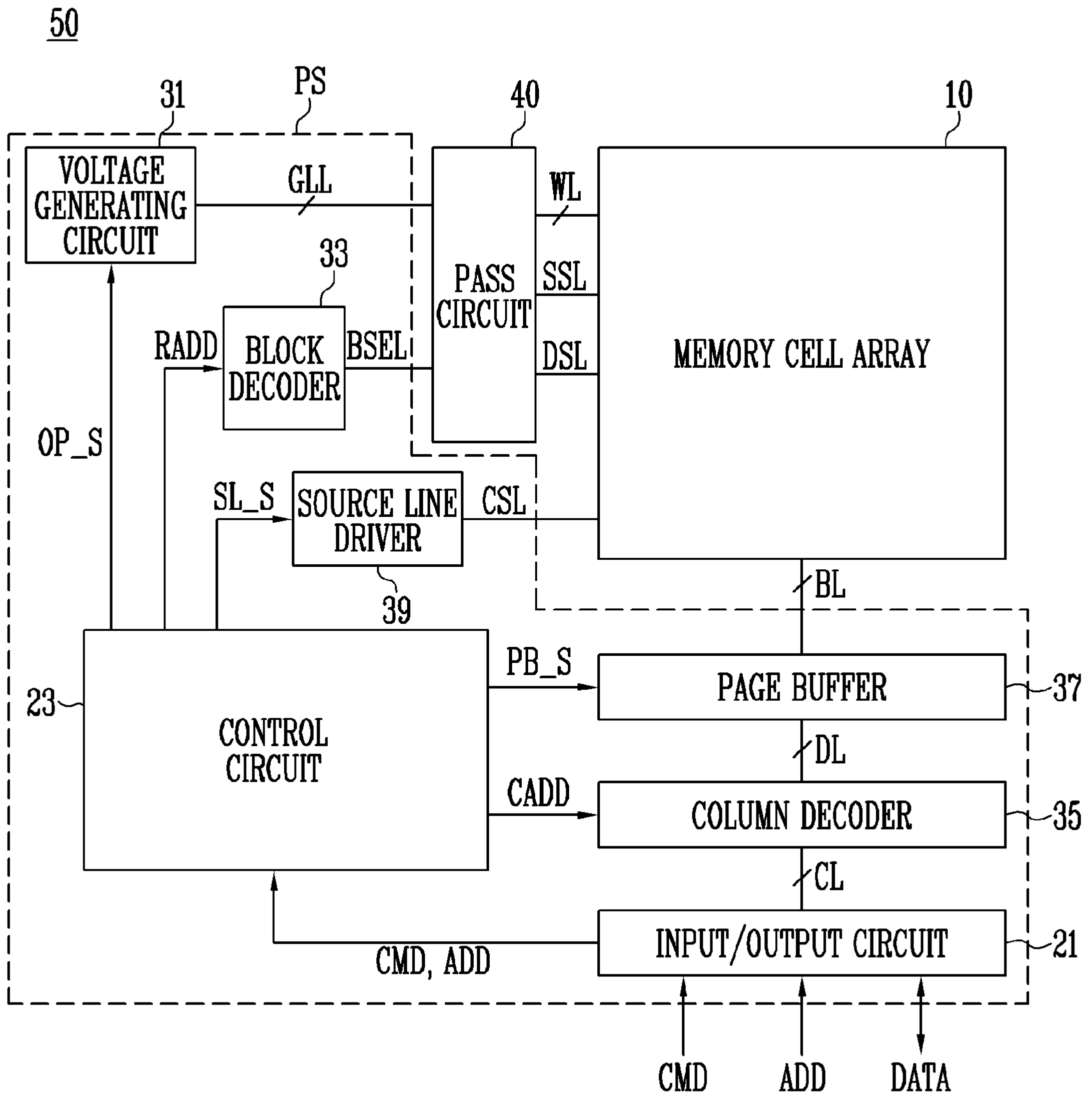
FIG. 1 is a block diagram illustrating a semiconductor memory device according to an embodiment of the present disclosure.

FIG. 1 is a block diagram illustrating a semiconductor memory device according to an embodiment of the present disclosure.

Referring to FIG. 1, the semiconductor memory device 50 may include a memory cell array 10, a pass circuit 40, and a peripheral circuit structure PS.

The memory cell array 10 may include a plurality of memory blocks. Each of the memory blocks may include a plurality of memory cells. Each of the memory cells may be a nonvolatile memory cell. As an embodiment, each memory cell may be a NAND flash memory cell. Hereinafter, an embodiment of the present disclosure is described based on the semiconductor memory device 50 including the NAND flash memory cell, but the present disclosure is not limited thereto. As another embodiment, each memory cell may be configured of a ferroelectric memory cell, a variable resistance memory cell, or the like.

The pass circuit 40 may be connected to the memory cell array 10 through a plurality of local lines. As an embodiment, the plurality of local lines may include a plurality of word lines WL, at least one source select line SSL, and at least one drain select line DSL.

The peripheral circuit structure PS may be configured to perform a program operation for storing data in the memory cell array 10, a read operation for outputting data stored in the memory cell array 10, and an erase operation for erasing data stored in the memory cell array 10. As an embodiment, the peripheral circuit structure PS may include an input/output circuit 21, a control circuit 23, a voltage generating circuit 31, a block decoder 33, a column decoder 35, a page buffer 37, and a source line driver 39.

The input/output circuit 21 may transfer a command CMD and an address ADD received from an external device (for example, a memory controller) of the semiconductor memory device 50 to the control circuit 23. The input/output circuit 21 may exchange data DATA with the external device and the column decoder 35.

The control circuit 23 may output an operation signal OP_S, a row address RADD, a source line control signal SL_S, a page buffer control signal PB_S, and a column address CADD in response to the command CMD and the address ADD.

The voltage generating circuit 31 may generate and output various operation voltages used for the program operation, the read operation, and the erase operation in response to the operation signal OP_S. The operation voltages output from the voltage generating circuit 31 may be transmitted to the pass circuit 40 through a plurality of global lines GLL.

The block decoder 33 may output a block select signal in response to the row address RADD. The block select signal output from the block decoder 33 may be transmitted to the pass circuit 40 through a block select line BSEL.

The pass circuit 40 may transfer the operation voltages transmitted to the plurality of global lines GLL to the drain select line DSL, the word line WL, and the source select line SSL in response to the block select signal transmitted to the block select line BSEL.

The column decoder 35 may transmit the data DATA input from the input/output circuit 21 to the page buffer 37 or transmit the data DATA stored in the page buffer 37 to the input/output circuit 21, in response to the column address CADD. The column decoder 35 may exchange the data DATA with the input/output circuit 21 through a column line CL. The column decoder 35 may exchange the data DATA with the page buffer 37 through a data line DL.

The page buffer 37 may store read data received through a bit line BL in response to the page buffer control signal PB_S. The page buffer 37 may sense a voltage or a current of the bit line BL during the read operation. The page buffer 37 may be connected to the memory cell array 10 through the bit line BL.

The source line driver 39 may control a voltage applied to a common source line CSL in response to the source line control signal SL_S. The source line driver 39 may be connected to the memory cell array 10 through the common source line CSL.

Figure 2:
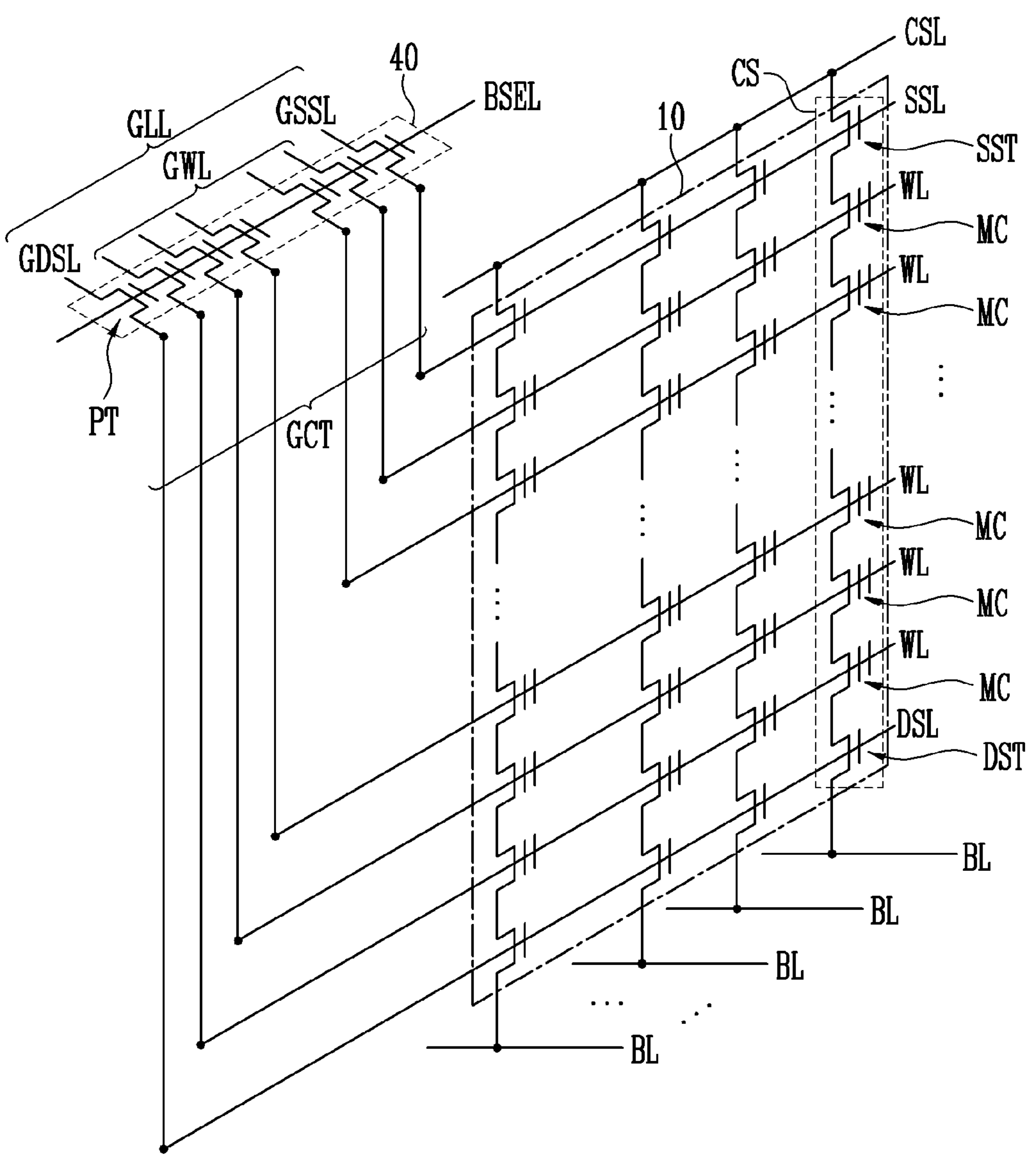
FIG. 2 is a circuit diagram illustrating a memory cell array and a pass circuit according to an embodiment of the present disclosure.

FIG. 2 is a circuit diagram illustrating a memory cell array and a pass circuit according to an embodiment of the present disclosure.

Referring to FIG. 2, the memory cell array 10 may include a plurality of memory cell strings CS. The plurality of memory cell strings CS may be connected to the plurality of bit lines BL and the common source line CSL.

Each memory cell string CS may include at least one source select transistor SST, a plurality of memory cells MC, and at least one drain select transistor DST.

The source select transistor SST may control an electrical connection between the plurality of memory cells MC and the common source line CSL. The drain select transistor DST may control an electrical connection between the plurality of memory cells MC and the bit line BL.

One source select transistor SST may be disposed or two or more source select transistors connected in series may be disposed between the common source line CSL and the plurality of memory cells MC. One drain select transistor DST may be disposed or two or more drain select transistors connected in series may be disposed between each bit line BL and the plurality of memory cells MC of the memory cell string CS corresponding thereto.

A plurality of gates of the plurality of memory cells MC may be respectively connected to the plurality of word lines WL. A gate of the source select transistor SST may be connected to the source select line SSL. A gate of the drain select transistor DST may be connected to the drain select line DSL.

The source select line SSL, the drain select line DSL, and the plurality of word lines WL may be connected to the pass circuit 40. The pass circuit 40 may include a plurality of pass transistors PT. The plurality of pass transistors PT may be respectively connected to a plurality of gate contact plugs GCT. The plurality of gate contact plugs GCT may be respectively connected to the source select line SSL, the drain select line DSL, and the plurality of word lines WL. Each pass transistor PT may be connected to a gate line corresponding thereto among the source select line SSL, the drain select line DSL, and the plurality of word lines WL via a gate contact plug GCT corresponding thereto.

The plurality of pass transistors PT may transfer voltages applied to the plurality of global lines GLL to the source select line SSL, the drain select line DSL, and the plurality of word lines WL in response to the block select signal applied to the block select line BSEL. The plurality of global lines GLL may include a global source select line GSSL, a global drain select line GDSL, and a plurality of global word lines GWL respectively corresponding to the source select line SSL, the drain select line DSL, and the plurality of word lines WL.

FIGS. 3, 4, 5, 6A, and 6B are diagrams illustrating a semiconductor memory device according to an embodiment of the present disclosure.

Figure 3:
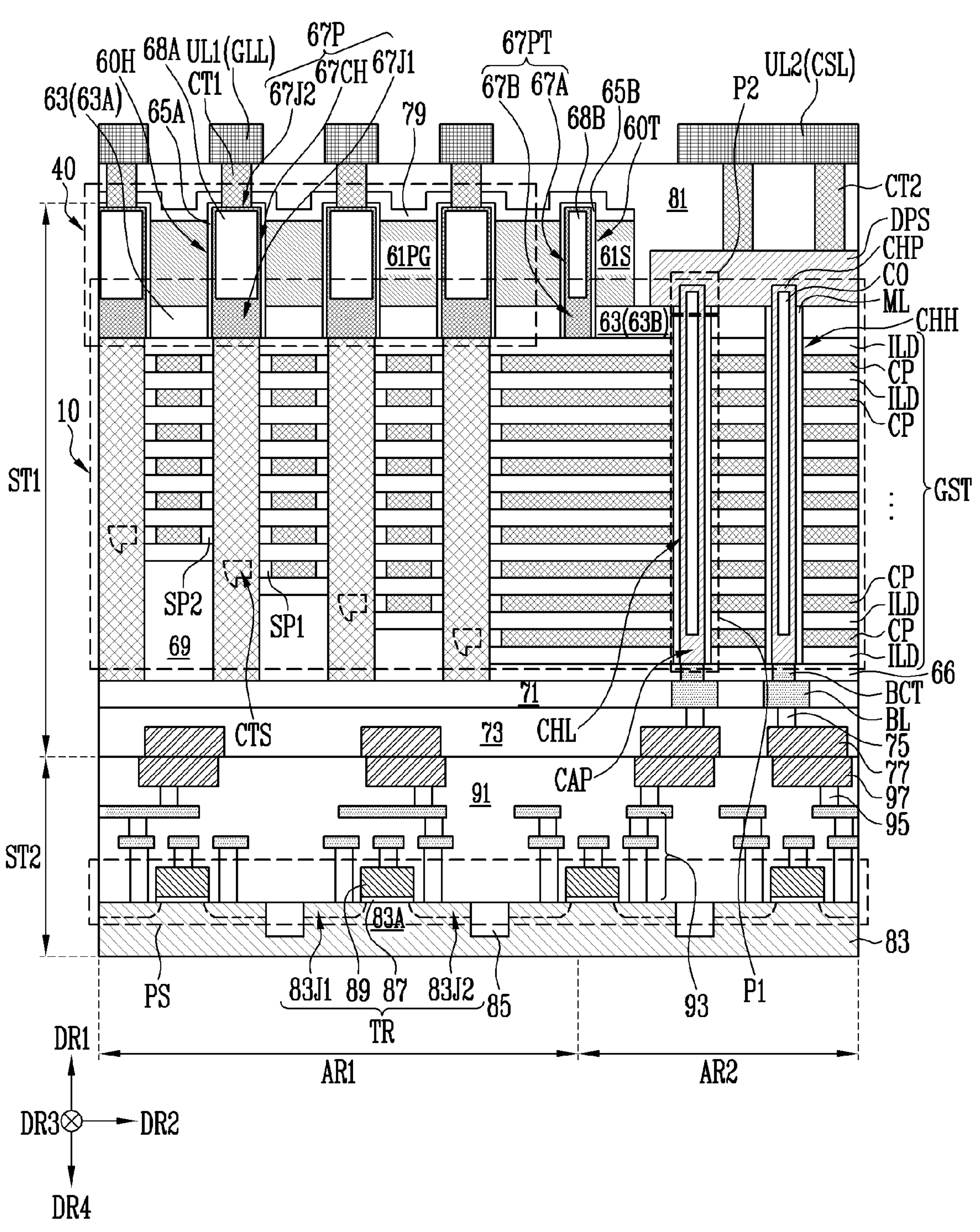
FIGS. 3, 4, 5, 6A, and 6B are diagrams illustrating a semiconductor memory device according to an embodiment of the present disclosure.

FIG. 3 is a cross-sectional view illustrating a semiconductor memory device according to an embodiment of the present disclosure.

Referring to FIG. 3, the semiconductor memory device may include a first structure ST1, a second structure ST2, a doped semiconductor layer DPS, a plurality of contacts CT1 and CT2, and a plurality of upper lines UL1 and UL2. The first structure ST1, the doped semiconductor layer DPS, and the plurality of contacts CT1 and CT2 may be disposed between the second structure ST2 and the plurality of upper lines UL1 and UL2.

The first structure ST1 may include the pass circuit 40, a plurality of gate contact plugs GCT connected to the pass circuit 40, the memory cell array 10 connected to the plurality of gate contact plugs GCT, the bit line BL connected to the memory cell array 10, and a plurality of first conductive bonding patterns 77. The pass circuit 40 may include a plurality of pass transistors PT of FIG. 2 configured of a pass gate 61PG, a plurality of active pillars 67P, and a plurality of pass gate insulating layers 65A. The memory cell array 10 may include a gate stack GST, a channel pillar CHP passing through the gate stack GST, and a memory layer ML interposed between the channel pillar CHP and the gate stack GST.

The pass gate 61PG and the doped semiconductor layer DPS may overlap the gate stack GST. The gate stack GST may extend from between the pass gate 61PG and the second structure ST2 to between the doped semiconductor layer DPS and the second structure ST2.

The first structure ST1 and the doped semiconductor layer DPS may be covered with at least one upper insulating layer 79 or 81. As an embodiment, the pass circuit 40 of the first structure ST1 may be covered with a first upper insulating layer 79, and the first upper insulating layer 79 and the doped semiconductor layer DPS may be covered with a second upper insulating layer 81.

The plurality of contacts CT1 and CT2 may pass through at least one of the first upper insulating layer 79 and the second upper insulating layer 81. The plurality of contacts CT1 and CT2 may be formed of a conductive material. The plurality of contacts CT1 and CT2 may include a plurality of first contacts CT1 and a plurality of second contacts CT2. The plurality of first contacts CT1 may pass through the first upper insulating layer 79 and the second upper insulating layer 81 and may be respectively connected to the plurality of active pillars 67P of the pass circuit 40. The second contact CT2 may pass through the second upper insulating layer 81 and may be connected to the doped semiconductor layer DPS.

The plurality of upper lines UL1 and UL2 may be disposed over the second upper insulating layer 81. The plurality of upper lines UL1 and UL2 may be conductive lines transmitting an electrical signal, and may include a plurality of first upper lines UL1 and a second upper line UL2. The plurality of first upper lines UL1 may be respectively connected to the plurality of first contacts CT1 and may be used as the plurality of global lines GLL. The second upper line UL2 may be connected to the second contact CT2 and may be used as the common source line CSL.

Although not shown in the figure, the semiconductor memory device may further include the block select line BSEL shown in FIG. 1 and may further include a third contact connecting the block select line BSEL shown in FIG. 1 to the pass gate 61PG. The block select line may be disposed over the second upper insulating layer 81, and the third contact may pass through the first upper insulating layer 79 and the second upper insulating layer 81 to be connected to the pass gate 61PG.

The second structure ST2 may include the peripheral circuit structure PS, a plurality of interconnections 93 connected to the peripheral circuit structure PS, and a plurality of second conductive bonding patterns 97 connected to the plurality of interconnections 93. The peripheral circuit structure PS may include a first region AR1 and a second region AR2.

Figure 4:
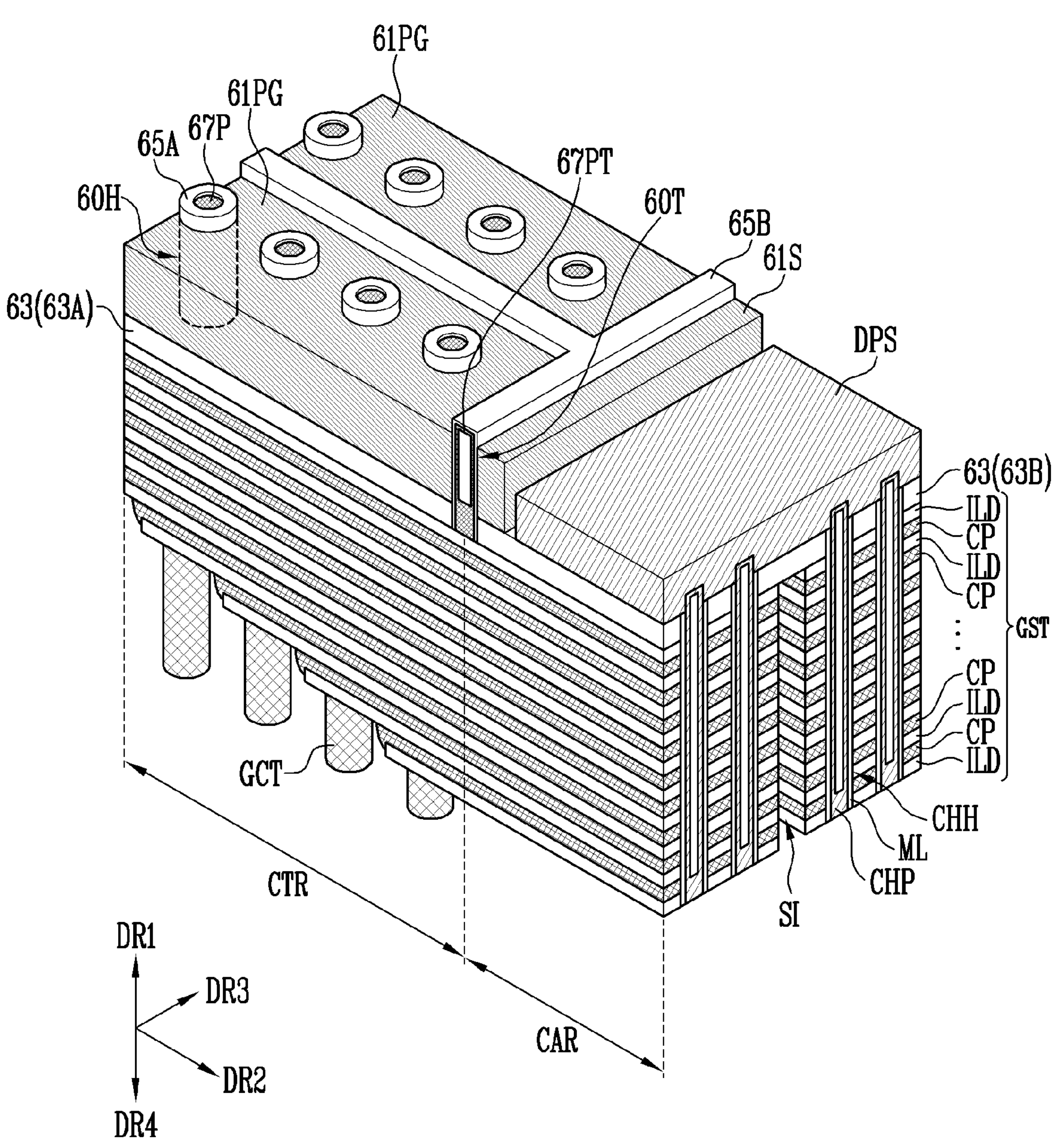
Figure 5:
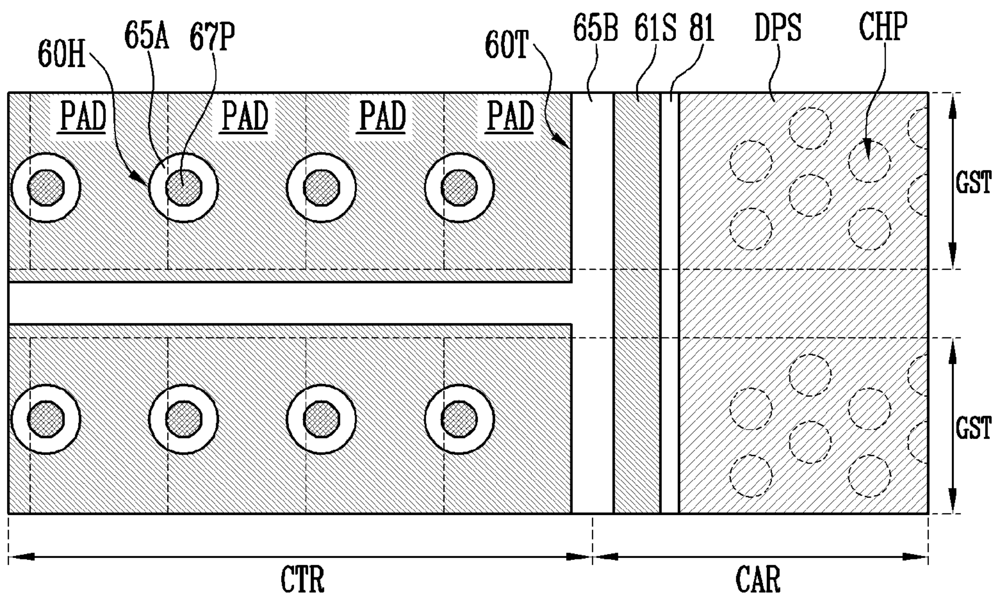
Figure 5:
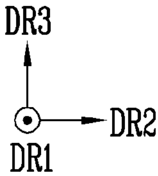

FIG. 4 is a perspective view illustrating the memory cell array 10, the doped semiconductor layer DPS, the gate contact plug GCT, and the pass circuit 40 shown in FIG. 3. FIG. 5 is a plan view illustrating the memory cell array 10, the doped semiconductor layer DPS, the gate contact plug GCT, and the pass circuit 40 shown in FIG. 3.

Referring to FIGS. 3 to 5, the pass gate 61PG and the doped semiconductor layer DPS may be spaced apart from the peripheral circuit structure PS in a first direction DR1. The pass gate 61PG may overlap the first region AR1 of the peripheral circuit structure PS with the gate stack GST and the plurality of gate contact plugs GCT interposed therebetween. The doped semiconductor layer DPS may overlap the second region AR2 of the peripheral circuit structure PS with the gate stack GST interposed therebetween. The doped semiconductor layer DPS may be spaced apart from the pass gate 61PG in a second direction DR2.

The pass gate 61PG may serve as a gate of each of the plurality of pass transistors PT shown in FIG. 2. The pass gate 61PG may include a plurality of active holes 60H respectively corresponding to the plurality of active pillars 67P. The pass gate 61PG may include a semiconductor material of a single-crystal structure or a poly-crystal structure. As an embodiment, the semiconductor material of the pass gate 61PG may be formed of an epitaxial wafer. The semiconductor material of the pass gate 61PG may include at least one of an n-type impurity and a p-type impurity. As an embodiment, the semiconductor material of the pass gate 61PG may be doped silicon including a p-type impurity as a majority carrier.

The plurality of active pillars 67P may be respectively disposed in the plurality of active holes 60H of the pass gate 61PG. The plurality of active pillars 67P may include a semiconductor material such as silicon or germanium. Each of the plurality of pass gate insulating layers 65A may surround a side of the active pillar 67P corresponding thereto. Accordingly, each pass gate insulating layer 65A may be interposed between the pass gate 61PG and the active pillar 67P corresponding thereto.

Referring to FIG. 3, each active pillar 67P may include a channel region 67CH, a first junction 67J1, and a second junction 67J2. The channel region 67CH of the active pillar 67P may serve as a channel of a pass transistor corresponding thereto, and each of the first junction 671 and the second junction 67J2 of the active pillar 67P may serve as a source or a drain of the pass transistor corresponding thereto. The channel region 67CH may be an undoped region or a doped region including at least one of a p-type impurity and an n-type impurity. Each of the first junction 67J1 and the second junction 67J2 may include at least one of an n-type impurity and a p-type impurity. As an embodiment, the first junction 67J1 and the second junction 67J2 may include an n-type impurity as a majority carrier, and the channel region 67CH may be an undoped region. The first junction 67J1 of the memory cell array 10 may face the gate stack GST, and the second junction 67J2 may face the first direction DR1, which is a direction opposite to the first junction 67J1. The channel region 67CH may be disposed between the first junction 67J1 and the second junction 67J2. The channel region 67CH may surround a first core insulating layer 68A. The first core insulating layer 68A may include a first surface facing the gate stack GST and a second surface facing a direction opposite to that of the first surface. The first junction 67J1 may extend to cover the first surface of the first core insulating layer 68A, and the second junction 67J2 may extend to cover the second surface of the first core insulating layer 68A. The pass gate insulating layer 65A may extend to cover the second junction 67J2 and may be penetrated by the first contact CT1 corresponding thereto.

Referring to FIGS. 3 to 5, the gate stack GST may include a plurality of conductive patterns CP spaced apart from each other in the first direction DR1 and stacked in the first direction DR1. The gate stack GST may further include a plurality of interlayer insulating layers ILD alternately stacked with the plurality of conductive patterns CP in the first direction DR1. Each conductive pattern CP and each interlayer insulating layer ILD may be formed in a plate shape. As an embodiment, each conductive pattern CP and each interlayer insulating layer ILD may include a surface extending in the second direction DR2 and a third direction DR3. The first direction DR1, the second direction DR2, and the third direction DR3 may be defined as directions pointed by three axes, each of three axes crosses a plane defined by the other two axes. A fourth direction DR4 may be opposite to the first direction DR1. The plurality of conductive patterns CP may be used as the drain select line DSL, the plurality of word lines WL, and the source select line SSL shown in FIG. 2. The plurality of conductive patterns CP may include at least one of a doped semiconductor layer and a metal layer. The doped semiconductor layer of each conductive pattern CP may include a doped silicon layer. The metal layer of each conductive pattern CP may include tungsten, copper, molybdenum, or the like. The plurality of conductive patterns CP may further include a metal nitride layer. The metal nitride layer may include titanium nitride, tantalum nitride, and the like. The plurality of interlayer insulating layers ILD may include a silicon oxide layer or the like.

The gate stack GST may include a contact region CTR and a cell array region CAR extending from the contact region CTR in the second direction DR2. The contact region CTR of the gate stack GST may overlap the pass gate 61PG, and the cell array region CAR of the gate stack GST may be opened by the pass gate 61PG. The doped semiconductor layer DPS may overlap the cell array region CAR of the gate stack GST opened by the pass gate 61PG. A side of the pass gate 61PG may include a region overlapping a side of the doped semiconductor layer DPS.

The plurality of conductive patterns CP and the plurality of interlayer insulating layers ILD may configure the contact region CTR of the gate stack GST between the first region AR1 of the peripheral circuit structure PS and the pass gate 61PG. The plurality of conductive patterns CP and the plurality of interlayer insulating layers ILD may be formed in a stepped structure in the contact region CTR. A plurality of ends of the plurality of conductive patterns CP may configure a plurality of pad portions PAD. The plurality of pad portions PAD may form a stepped structure of the gate stack GST and may correspond to a plurality of steps disposed at different levels. The plurality of pad portions PAD may respectively overlap the plurality of active pillars 67P. The plurality of pad portions PAD and the plurality of active pillars 67P may be arranged in a line in the second direction DR2. An embodiment of the present disclosure is not limited thereto. As another embodiment, the plurality of pad portions PAD and the plurality of active pillars 67P may be arranged in a plurality of rows and a plurality of columns.

The plurality of conductive patterns CP and the plurality of interlayer insulating layers ILD may extend between the doped semiconductor layer DPS and the second region AR2 of the peripheral circuit structure PS to configure the cell array region CAR. The plurality of conductive patterns CP and the plurality of interlayer insulating layers ILD may be penetrated by the plurality of channel holes CHH in the cell array region CAR. The channel pillar CHP may be disposed in each channel hole CHH. The channel pillar CHP may be formed of a semiconductor material. As an embodiment, the channel pillar CHP may include silicon, germanium, or a mixture thereof. A second core insulating layer CO may be disposed inside the channel pillar CHP. The second core insulating layer CO may include an insulating material such as silicon oxide. The channel pillar CHP may include a channel layer CHL and a capping pattern CAP. The channel layer CHL may be used as a channel region of a memory cell string corresponding thereto and may surround a side of the second core insulating layer CO. The channel layer CHL may extend to cover a first surface of the second core insulating layer CO facing the first direction DR1. The capping pattern CAP may cover a second surface of the second core insulating layer CO facing the fourth direction DR4. The capping pattern CAP may be used as a drain junction of the memory cell string. The capping pattern CAP may include at least one of an n-type impurity and a p-type impurity. As an embodiment, the capping pattern CAP may include an n-type impurity as a majority carrier.

The memory layer ML may include a blocking insulating layer between the channel pillar CHP and the gate stack GST, a data storage layer between the blocking insulating layer and the channel pillar CHP, and a tunnel insulating layer between the data storage layer and the channel pillar CHP. The blocking insulating layer may include an insulating material capable of blocking a charge. The tunnel insulating layer may include an insulating material capable of charge tunneling. The blocking insulating layer may include an insulating layer having a dielectric constant higher than that of the tunnel insulating layer. The data storage layer may be formed of a material layer capable of storing changed data using Fowler Nordheim tunneling. As an embodiment, the data storage layer may be formed of a charge trap insulating layer or an insulating layer including conductive a nano dot. The charge trap insulating layer may include a silicon nitride layer. The present disclosure is not limited thereto, and the data storage layer may be formed of a material layer capable of storing information based on an operation principle other than Fowler Nordheim tunneling. As an embodiment, the data storage layer may include a phase change material layer, a ferroelectric layer, and the like. In this case, the channel pillar CHP may be replaced with a pillar shape electrode structure.

The plurality of gate contact plugs GCT may be respectively connected to the plurality of active pillars 67P. As an embodiment, each gate contact plug GCT may contact the first junction 67J1 of the active pillar 67P corresponding thereto and extend in the fourth direction DR4. The plurality of gate contact plugs GCT may pass through the gate stack GST in the contact region CTR of the gate stack GST. Each gate contact plug GCT may include at least one of a doped semiconductor layer and a metal layer. The doped semiconductor layer of the gate contact plug GCT may include a doped silicon layer. The metal layer of the gate contact plug GCT may include tungsten, copper, molybdenum, or the like. Each gate contact plug GCT may further include a metal nitride layer. The metal nitride layer may include titanium nitride, tantalum nitride, and the like. The metal nitride layer may be formed along a surface of the metal layer.

Figure 6A:
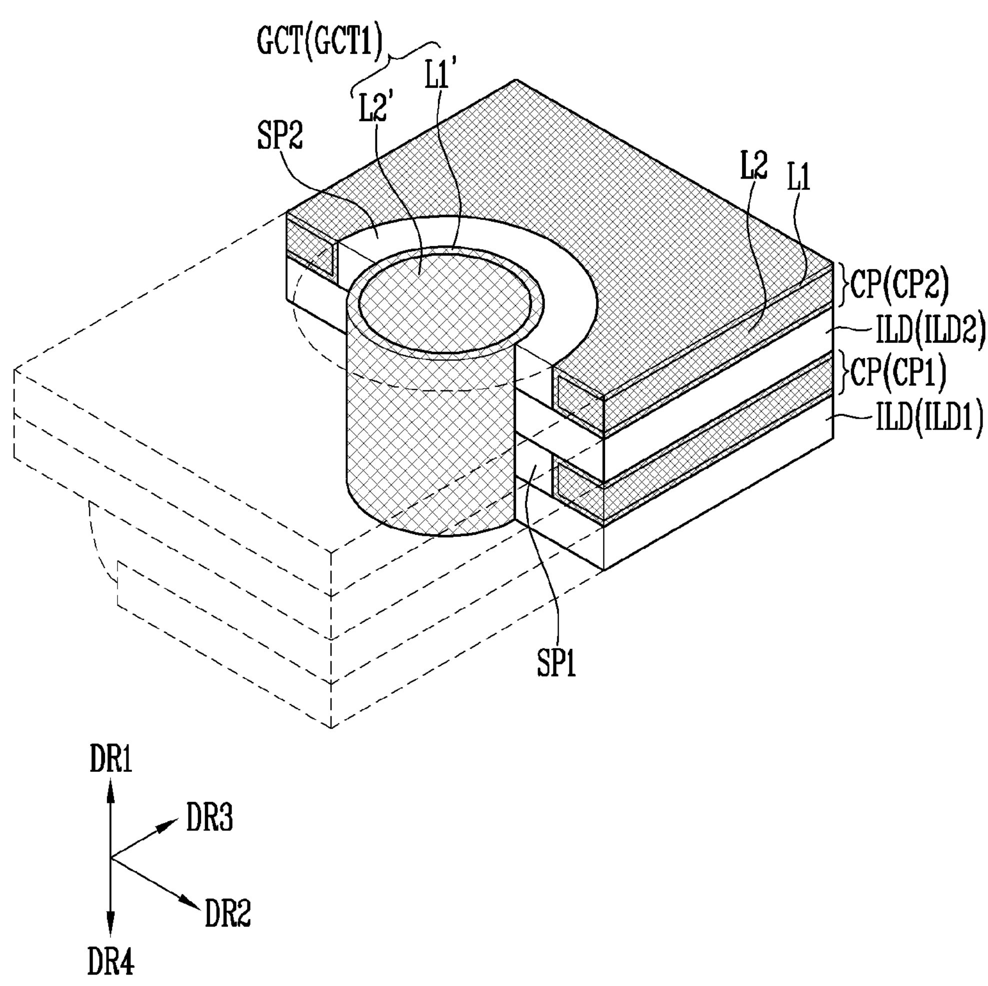
Figure 6B:
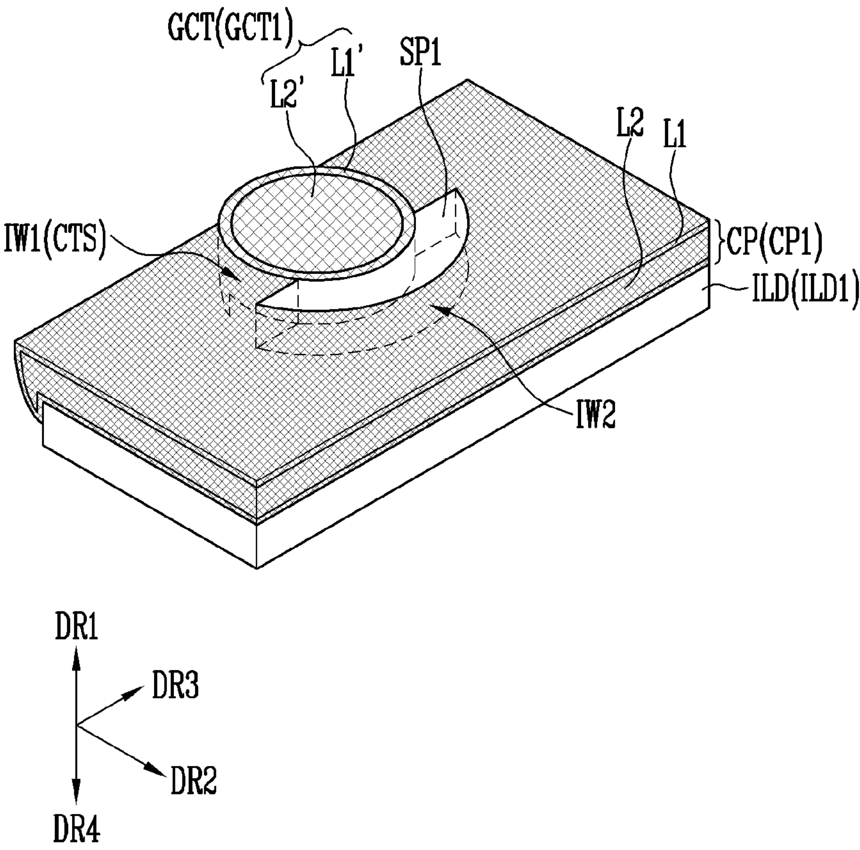

FIGS. 6A and 6B are perspective views illustrating a portion of the gate stack GST and a portion of the gate contact plug GCT shown in FIG. 3. FIG. 6A illustrates a portion of configurations of the semiconductor memory device through perspective for convenience of recognition.

Referring to FIGS. 3, 5, 6A, and 6B, the plurality of gate contact plugs GCT may pass through the plurality of pad portions PAD, respectively. Each gate contact plug GCT may form a contact surface CTS with an end of a conductive pattern configuring a corresponding pad portion among the plurality of pad portions PAD of the plurality of conductive patterns CP. For example, the plurality of gate contact plugs GCT may include a first gate contact plug GCT1. The plurality of conductive patterns CP may include a first conductive pattern CP1 and a second conductive pattern CP2 adjacent to each other in the first direction DR1. An end of the first conductive pattern CP1 may form the contact surface CTS with the first gate contact plug GCT1, and the second conductive pattern CP2 may be insulated from the first gate contact plug GCT1.

A plurality of insulating spacers SP1 and SP2 may be interposed between the plurality of gate contact plugs GCT and the plurality of conductive patterns CP. The plurality of insulating spacers SP1 and SP2 may include a first insulating spacer SP1 and a plurality of second insulating spacers SP2 buried in each conductive pattern CP. The first insulating spacer SP1 may be adjacent to the contact surface CTS between the conductive pattern CP and the gate contact plug GCT corresponding thereto, and may surround a portion of a side of the gate contact plug GCT to open the contact surface CTS. Each second insulating spacer SP2 may be spaced apart from the contact surface CTS and may be interposed between the gate contact plug GCT and the conductive pattern CP requiring mutual insulation. Each second insulating spacer SP2 may be formed in an annular shape to surround a side of the gate contact plug GCT. For example, the first insulating spacer SP1 may be adjacent to the contact surface CTS between the first gate contact plug GCT1 and the first conductive pattern CP1, and may surround a portion of a side of the first gate contact plug GCT1. The second insulating spacer SP2 may be interposed between the first gate contact plug GCT1 and the second conductive pattern CP2 and may surround a side of the first gate contact plug GCT1 in an annular shape.

Each conductive pattern (for example, CP1) may include a first inner sidewall IW1 and a second inner sidewall IW2. The first inner sidewall IW1 of each conductive pattern (for example, CP1) may form a contact surface CTS with a gate contact plug (for example, GCT1) corresponding thereto. The second inner sidewall IW2 may extend from the first inner sidewall IW1 along a side of the first insulating spacer SP1.

Each of the first insulating spacer SP1 and the plurality of second insulating spacers SP2 may be interposed between interlayer insulating layers ILD adjacent in the first direction DR1. For example, the plurality of interlayer insulating layers ILD may include a first interlayer insulating layer ILD1 and a second interlayer insulating layer ILD2 adjacent to each other in the first direction DR1 with the first conductive pattern CP1 interposed therebetween, and the first insulating spacer SP1 may be interposed between the first interlayer insulating layer ILD1 and the second interlayer insulating layer ILD2.

Each conductive pattern CP may include a metal nitride layer L1 and a metal layer L2, and each gate contact plug GCT may include a metal nitride layer L1' and a metal layer L2'. In this case, the contact surface CTS may be defined by contact between the metal nitride layer L1 of the conductive pattern CP and the metal nitride layer L1' of the gate contact plug GCT.

Referring to FIGS. 3 to 5, the gate stack GST may be partitioned in a memory block unit by the slit SI. As an embodiment, the gate stack of a first memory block may be adjacent to the gate stack of a second memory block in the third direction DR3 with the slit SI interposed therebetween.

The pass gate 61PG may be partitioned by a trench 60T. As an embodiment, a first pass gate may overlap the gate stack of the first memory block, and a second pass gate may overlap the gate stack of the second memory block. In this case, the first pass gate may adjacent to the second pass gate in the third direction DR3 with the trench 60T interposed therebetween.

The trench 60T may be filled with a partition wall structure 67PT and a partition wall insulating layer 65B. The partition wall insulating layer 65B may cover a side of the partition wall structure 67PT. The partition wall structure 67PT may include the same material as the plurality of active pillars 67P. As an embodiment, the partition wall structure 67PT may include a partition wall channel layer 67A and a partition wall capping pattern 67B. The partition wall channel layer 67A may include the same material as the channel region 67CH of the active pillar 67P. A partition wall core insulating layer 68B may be disposed inside the partition wall channel layer 67A. The partition wall channel layer 67A may extend to cover a first surface of the partition wall core insulating layer 68B facing the first direction DR1. The partition wall capping pattern 67B may include the same material as the first junction 67J1 of the active pillar 67P. The partition wall capping pattern 67B may cover a second surface of the partition wall core insulating layer 68B facing the fourth direction DR4. The partition wall insulating layer 65B may include the same material as the pass gate insulating layer 65A. The partition wall insulating layer 65B may extend to cover a surface of the partition wall structure 67PT facing the first direction DR1.

The semiconductor memory device may further include a semiconductor pattern 61S between the pass gate PG and the doped semiconductor layer DPS. The semiconductor pattern 61S may overlap the gate stack GST. The semiconductor pattern 61S may include the same material as the pass gate PG. Each of the trench 60T, the partition wall structure 67PT, and the partition wall insulating layer 65B may extend between the semiconductor pattern 61S and the pass gate 61PG.

The first upper insulating layer 79 may extend to cover the pass gate PG, the partition wall structure 67PT, the partition wall insulating layer 65B, and the semiconductor pattern 61S. The second upper insulating layer 81 may extend between the semiconductor pattern 61S and the doped semiconductor layer DPS.

The first structure ST1 may further include an interposition insulating layer 63. The interposition insulating layer 63 may include a first interposition portion 63A and a second interposition portion 63B. The first interposition portion 63A may be disposed between the gate stack GST and the pass gate 61PG. The second interposition portion 63B may be disposed between the gate stack GST and the doped semiconductor layer DPS, and may extend between the gate stack GST and the semiconductor pattern 61S.

The plurality of active pillars 67P, the plurality of pass gate insulating layers 65A, the partition wall structure 67PT, and the partition wall insulating layer 65B may extend to pass through the interposition insulating layer 63. The first interposition portion 63A and the second interposing portion 63B of the interposition insulating layer 63 may be spaced apart with the partition wall structure 67PT and the partition wall insulating layer 65B interposed therebetween.

The plurality of active pillars 67P may pass through the first interposition portion 63A of the interposition insulating layer 63 to contact the plurality of gate contact plugs GCT. The plurality of conductive patterns CP may be electrically connected to the plurality of active pillars 67P of the pass circuit 40 by the plurality of gate contact plugs GCT.

The channel pillar CHP and the memory layer ML may extend to pass through the second interposition portion 63B of the interposition insulating layer 63. The channel pillar CHP may protrude in the first direction DR1 in comparison with the second interposition portion 63B of the interposition insulating layer 63 and the memory layer ML. More specifically, the channel pillar CHP may include a first portion P1 and a second portion P2. The first portion P1 of the channel pillar CHP may pass through the gate stack GST and the second interposition portion 63B of the interposition insulating layer 63, and the second portion P2 may be embedded in the doped semiconductor layer DPS by extending from the first portion P1. The second portion P2 of the channel pillar CHP may contact the doped semiconductor layer DPS. A portion of a side of the pass gate 61PG may overlap the second portion P2 of the channel pillar CHP.

The doped semiconductor layer DPS may surround the second portion P2 of the channel pillar CHP. The doped semiconductor layer DPS may extend in the second direction DR2 and the third direction DR3 to overlap the cell array region CAR of the gate stack GST. A plurality of channel pillars CHP may be disposed between the doped semiconductor layer DPS and the peripheral circuit structure PS, and the plurality of channel pillars CHP may be connected to the doped semiconductor layer DPS in parallel.

The doped semiconductor layer DPS may include at least one of an n-type impurity and a p-type impurity. The doped semiconductor layer DPS may be used as at least one of a source region and a well region. As an embodiment, the doped semiconductor layer DPS may be provided as the source region including an n-type impurity as a majority carrier. Embodiments of the present disclosure are not limited thereto. As another embodiment, the doped semiconductor layer DPS may include at least one of a first conductivity type doped region including an n-type impurity as a majority carrier and a second conductivity type doped region including a p-type impurity as a majority carrier. The first conductivity type doped region may serve as the source region, and the second conductivity type doped region may serve as the well region.

Referring to FIG. 3, the channel pillar CHP of the first structure ST1 may be disposed between the doped semiconductor layer DPS and the bit line BL. The bit line BL may be formed of a conductive material and may be connected to the channel pillar CHP corresponding thereto. As an embodiment, the bit line BL may be connected to the capping pattern CAP of the channel pillar CHP corresponding thereto via a conductive bit line contact BCT.

The conductive bit line contact BCT may pass through a buffer insulating layer 66 interposed between the gate stack GST and the bit line BL. The bit line BL may pass through an insulating layer 71 between the buffer insulating layer 66 and the second structure ST2. The insulating layer 71 may extend between the gate stack GST and the first region AR1 of the peripheral circuit structure PS. A filling insulating layer 69 may be disposed between the stepped structure of the gate stack GST and the insulating layer 71. The gate contact plugs GCT may extend to pass through the filling insulating layer 69.

The plurality of first conductive bonding patterns 77 of the first structure ST1 may be disposed in the first insulating structure 73. The first insulating structure 73 may be interposed between the second structure ST2 and the insulating layer 71. The first insulating structure 73 may include multiple layers of insulating layers. The plurality of first conductive bonding patterns 77 may include a metal such as copper. A portion of the plurality of first conductive bonding patterns 77 may be connected to the bit line BL. As an embodiment, the bit line BL may be connected to a portion of the plurality of first conductive bonding patterns 77 via a first conductive bonding contact 75. The first conductive bonding contact 75 may be disposed in the first insulating structure 73 between the bit line BL and the first conductive bonding pattern 77 corresponding thereto.

The peripheral circuit structure PS of the second structure ST2 may include a plurality of transistors TR formed on a semiconductor layer 83. The semiconductor layer 83 may include silicon, germanium, or the like. A portion of the plurality of transistors TR may configure the page buffer 37 shown in FIG. 1.

Each transistor TR may include a gate insulating layer 87, a gate electrode 89, a source junction 83J1, and a drain junction 83J2. The gate insulating layer 87 and the gate electrode 89 may be stacked on an active region 83A of the semiconductor layer 83. The active region 83A of the semiconductor layer 83 may be partitioned by an isolation layer 85. The source junction 83J1 and the drain junction 83J2 may be formed in the active region 83A of both sides of the gate electrode 89.

The peripheral circuit structure PS may be covered with a second insulating structure 91. The second insulating structure 91 may include multiple layers of insulating layers.

The plurality of interconnections 93 of the second structure ST2 may be disposed in the second insulating structure 91. The plurality of interconnections 93 may include a plurality of conductive patterns connected to the gate electrode 89, the source junction 83J1, and the drain junction 83J2. The plurality of interconnections 93 may be connected to the plurality of second conductive bonding patterns 97 via a plurality of second conductive bonding contacts 95.

The plurality of second conductive bonding patterns 97 may include a metal such as copper. Each of the plurality of second conductive bonding contacts 95 may be disposed between the second conductive bonding pattern 97 corresponding thereto and the interconnection 93 and may be disposed in the second insulating structure 91.

The plurality of second conductive bonding patterns 97 may be bonded to the plurality of first conductive bonding patterns 77 to be structurally and electrically connected to the plurality of first conductive bonding patterns 77. A portion of the plurality of second conductive bonding patterns 97 may be connected to portion of the plurality of transistors TR via the second conductive bonding contact 95 and the interconnection 93. In an embodiment, at least one of second conductive bonding patterns 97 may be connected to a transistor of the page buffer via the second conductive bonding contact 95 and the interconnection 93.

Referring to FIGS. 3 to 5, the pass gate 61PG may be used as a plurality of gates of the plurality of pass transistors of the pass circuit 40. Accordingly, the plurality of pass transistors of the pass circuit 40 may be commonly controlled according to an electrical signal applied to the pass gate 61PG.

Referring to FIGS. 3 to 5, because the plurality of active pillars 61P are respectively disposed in the plurality of active holes 60H of the pass gate 61PG, each of the plurality of pass transistors may be formed in a surrounding gate transistor (SGT) structure. Accordingly, an area occupied by the plurality of pass transistors may be reduced and an on/off characteristic of each pass transistor may be improved.

Referring to FIG. 3, because the pass circuit 40 is disposed to overlap the peripheral circuit structure PS with the gate stack GST interposed therebetween, an area allocated to the pass circuit 40 in the semiconductor layer 83 may be reduced. Accordingly, an integration degree of the semiconductor memory device may be improved.

Referring to FIGS. 3 to 5, the plurality of active pillars 67P of the pass circuit 40 may overlap the contact region CTR of the gate stack GST opened by the doped semiconductor layer DPS. Accordingly, because the area allocated to the pass circuit 40 may be reduced, the integration degree of the semiconductor memory device may be improved. In addition, the plurality of active pillars 67P of the pass circuit 40 may overlap the plurality of gate contact plugs GCT disposed in the contact region CTR of the gate stack GST. Accordingly, because the plurality of gate contact plugs GCT and the plurality of active pillars 67P may be directly connected, a connection structure between the plurality of conductive patterns CP and the pass circuit 40 may be simplified.

FIGS. 7A to 7C, 8, 9A to 9D, 10A, 10B, 11A, 11B, and 12A to 12K are diagrams illustrating a method of manufacturing a semiconductor memory device according to an embodiment of the present disclosure.

Figure 7A:
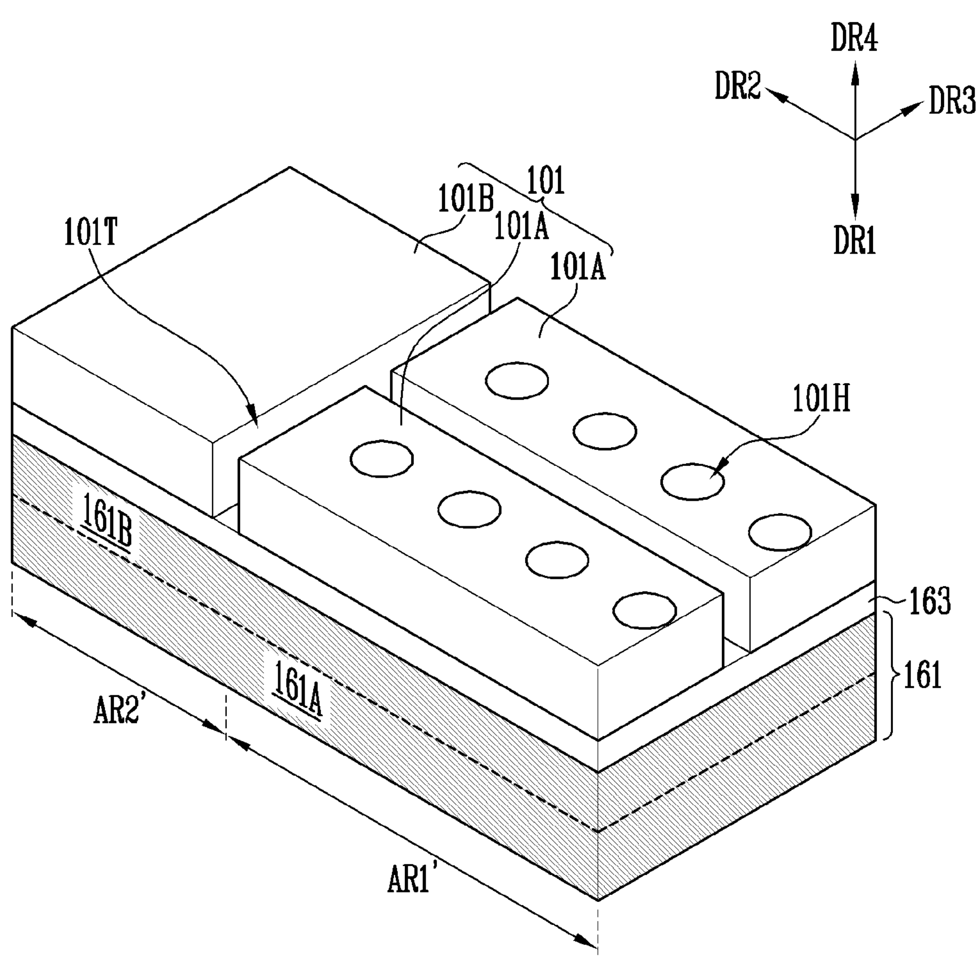
FIGS. 7A to 7C, 8, 9A to 9D, 10A, 10B, 11A, 11B, and 12A to 12K are diagrams illustrating a method of manufacturing a semiconductor memory device according to an embodiment of the present disclosure.
Figure 7B:
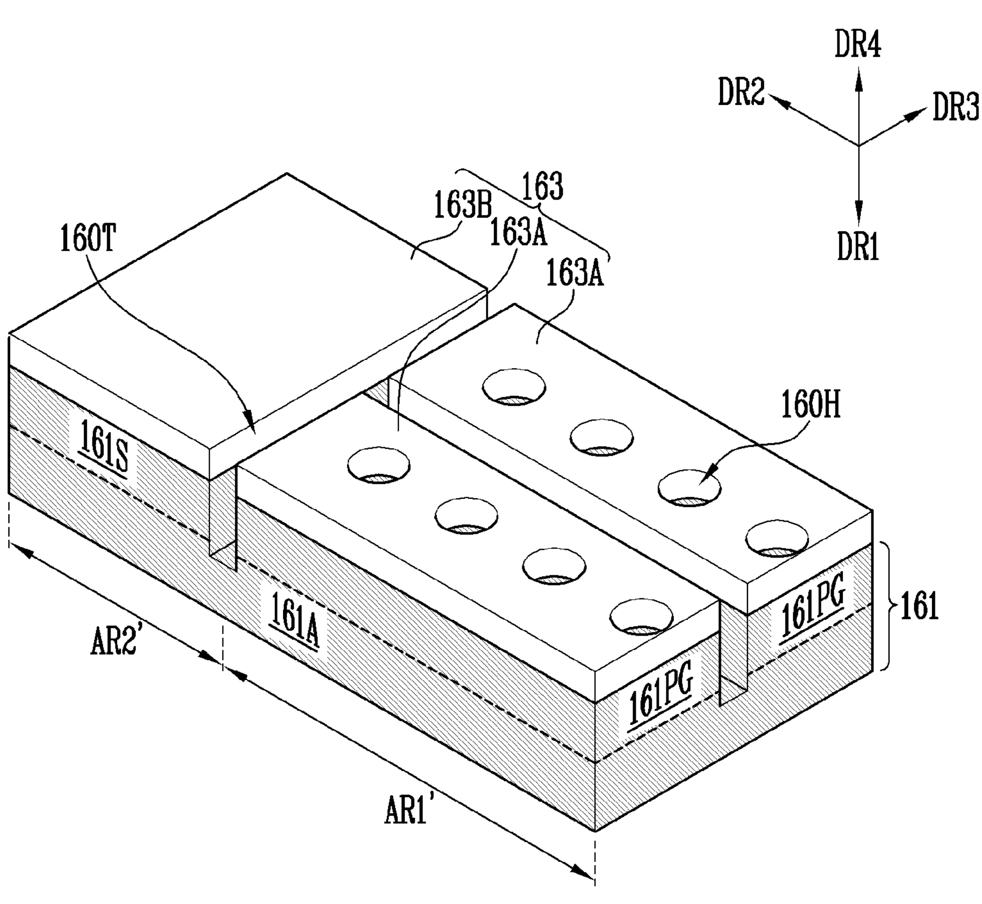
Figure 7C:
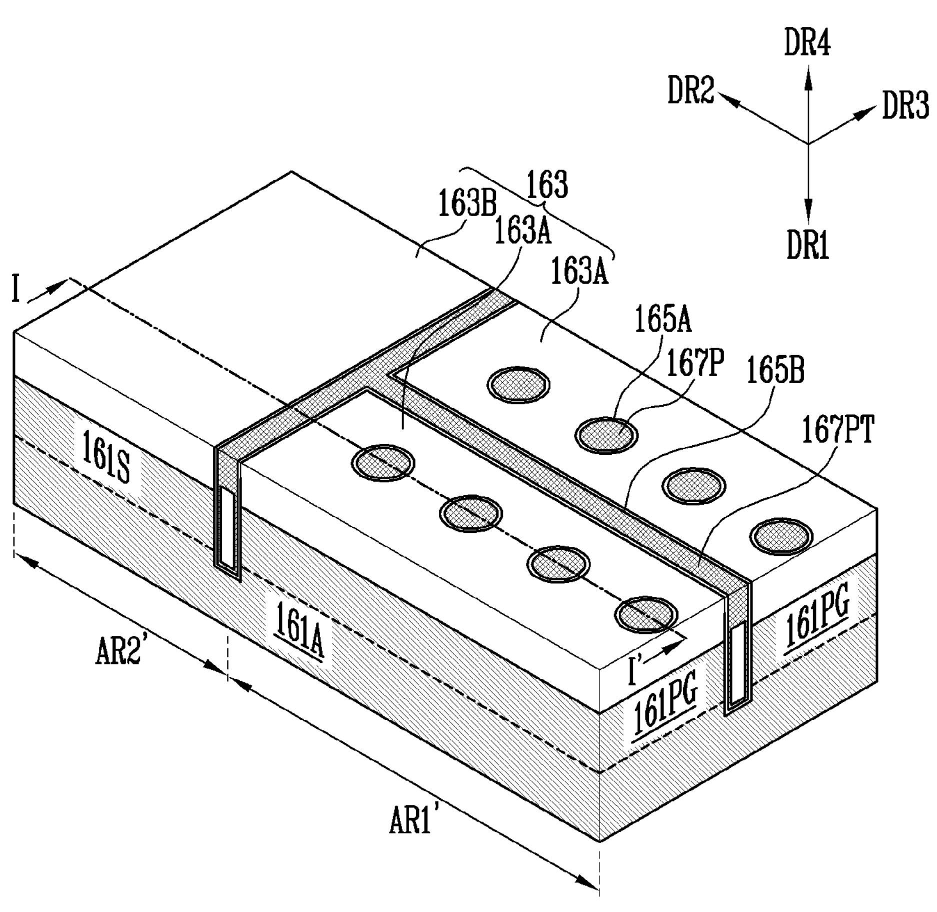

FIGS. 7A to 7C are perspective views illustrating a process of forming the plurality of active pillars and the pass gate.

Referring to FIG. 7A, an interposition insulating layer 163 may be formed over a preliminary pass gate layer 161 including a first region AR1' and a second region AR2'. The preliminary pass gate layer 161 may include a semiconductor material of a single crystal structure or a poly-crystal structure. As an embodiment, the preliminary pass gate layer 161 may be an epitaxial wafer. As an embodiment, the epitaxial wafer may be a silicon wafer. The preliminary pass gate layer 161 formed of the epitaxial wafer may include a seed region 161A and an epitaxial region 161B. The seed region 161A and the epitaxial region 161B may include at least one of an n-type impurity and a p-type impurity. A concentration of a majority carrier in the seed region 161A may be higher than a concentration of a majority carrier in the epitaxial region 161B. Accordingly, an etching selectivity of the seed region 161A with respect to the epitaxial region 161B may be increased. As an embodiment, the seed region 161A and the epitaxial region 161B may include the p-type impurity as the majority carrier, and the seed region 161A may include the p-type impurity at a concentration higher than that of the epitaxial region 161B.

Hereinafter, a direction in which a rear surface of the preliminary pass gate layer 161 faces may be defined as the first direction DR1, directions in which the rear surface of the preliminary pass gate layer 161 extends may be defined as the second direction DR2 and the third direction DR3, and a direction opposite to the first direction DR1 may be defined as the fourth direction DR4. The first direction DR1 and the fourth direction DR4 may correspond to a-Z-axis direction and a +Z-axis direction, respectively, and the second direction DR2 and the third direction DR3 may correspond to an X-axis direction and a Y-axis direction, respectively. The second region AR2' of the preliminary pass gate layer 161 may extend from the first region AR1' in the second direction DR2. Each of the seed region 161A and the epitaxial region 161B of the preliminary pass gate layer 161 may be formed in the first region AR1' and the second region AR2' of the preliminary pass gate layer 161. The rear surface of the preliminary pass gate layer 161 may be defined as a rear surface of the seed region 161A. The interposition insulating layer 163 may be disposed in contact with the epitaxial region 161B.

Subsequently, a first mask pattern 101 may be formed on the interposition insulating layer 163. The first mask pattern 101 may include a plurality of first mask portions 101A and a plurality of second mask portion 101B. The plurality of first mask portions 101A may overlap the first region AR1' of the preliminary pass gate layer 161 and may be spaced apart from each other in the third direction DR3 with a trench type opening 101T interposed therebetween. Each first mask portion 101A may have a plurality of hole type openings 101H. The second mask portion 101B may overlap the second region AR2' of the preliminary pass gate layer 161. The trench type opening 101T may extend between each of the plurality of first mask portions 101A and the second mask portion 101B.

Referring to FIG. 7B, the interposition insulating layer 163 and the preliminary pass gate layer 161 may be etched by an etching process using the mask pattern 101 shown in FIG. 7A as an etch barrier. A trench 160T and a plurality of active holes 160H may be defined in a region where the interposition insulating layer 163 and the preliminary pass gate layer 161 are etched.

By the etching process of the interposition insulating layer 163, the interposition insulating layer 163 may be separated into a plurality of first interposition portions 163A and a second interposing portion 163B. The plurality of first interposition portions 163A and the second interposing portion 163B may be separated from each other by the trench 160T. Each of the first interposition portions 163A may be penetrated by the plurality of active holes 160H.

By the etching process of the preliminary pass gate layer 161, a portion of the preliminary pass gate layer 161 may be etched at a boundary between the first region AR1' and the second region AR2', and a portion of the first region AR1' of the preliminary pass gate layer 161 may be etched. Thus, the epitaxial region 161B of the preliminary pass gate layer 161 shown in FIG. 7A may be partitioned into a plurality of pass gates 161PG and a semiconductor pattern 161S. The plurality of pass gates 161PG and the semiconductor pattern 161S may be spaced apart from each other by the trench 160T. Each pass gate 161PG may be penetrated by the plurality of active holes 160H. The plurality of pass gates 161PG and the semiconductor pattern 161S may be connected to the seed region 161A of the preliminary pass gate layer 161. The seed region 161A of the preliminary pass gate layer 161 may be exposed by the trench 160T and the plurality of active holes 160H.

The plurality of first interposition portions 163A of the interposition insulating layer 163 and the plurality of pass gates 161PG of the preliminary pass gate layer 161 may be defined in a region corresponding to the plurality of first mask portions 101A of the first mask pattern 101 shown in FIG. 7A. The second interposition portion 163B of the interposition insulating layer 163 and the semiconductor pattern 161S of the preliminary pass gate layer 161 may be defined in a region corresponding to the second mask portion 101B of the first mask pattern 101 shown in FIG. 7A.

The trench 160T and the plurality of active holes 160H may be defined by passing through the interposition insulating layer 163 and the epitaxial region 161B of the preliminary pass gate layer 161 shown in FIG. 7A. The trench 160T may be defined in a region corresponding to the trench type opening 101T of the first mask pattern 101 shown in FIG. 7A, and the plurality of active holes 160H may be defined in a region corresponding to the plurality of hole type openings 101H of the first mask pattern 101 shown in FIG. 7A. The mask pattern 101 shown in FIG. 7A may be removed after forming the trench 160T and the plurality of active holes 160H.

Referring to FIG. 7C, after forming an insulating layer along a surface of each of the trench 160T and the plurality of active holes 160H shown in FIG. 7B, a channel layer may be formed on the insulating layer. Subsequently, a gap fill insulating layer and a doped semiconductor layer filling a central region of each of the trench 160T and the plurality of active holes 160H shown in FIG. 7B may be formed on the channel layer. Thereafter, a planarization process such as chemical mechanical polishing may be performed so that the interposition insulating layer 163 is exposed. The insulating layer may be formed by depositing an insulating material such as a silicon oxide layer or by using an oxidation process. The channel layer may include a semiconductor material such as silicon or germanium. The doped semiconductor layer may include at least one of a p-type impurity and an n-type impurity. As an embodiment, the doped semiconductor layer may be formed of an n-type doped silicon layer including an n-type impurity as a majority carrier.

Through the above-described series of processes, an active pillar 167P surrounded by a pass gate insulating layer 165A may be formed inside each of the plurality of active holes 160H shown in FIG. 7B, and a partition wall structure 167PT surrounded by a partition wall insulating layer 165B may be formed inside the trench 160T shown in FIG. 7B.

Figure 8:
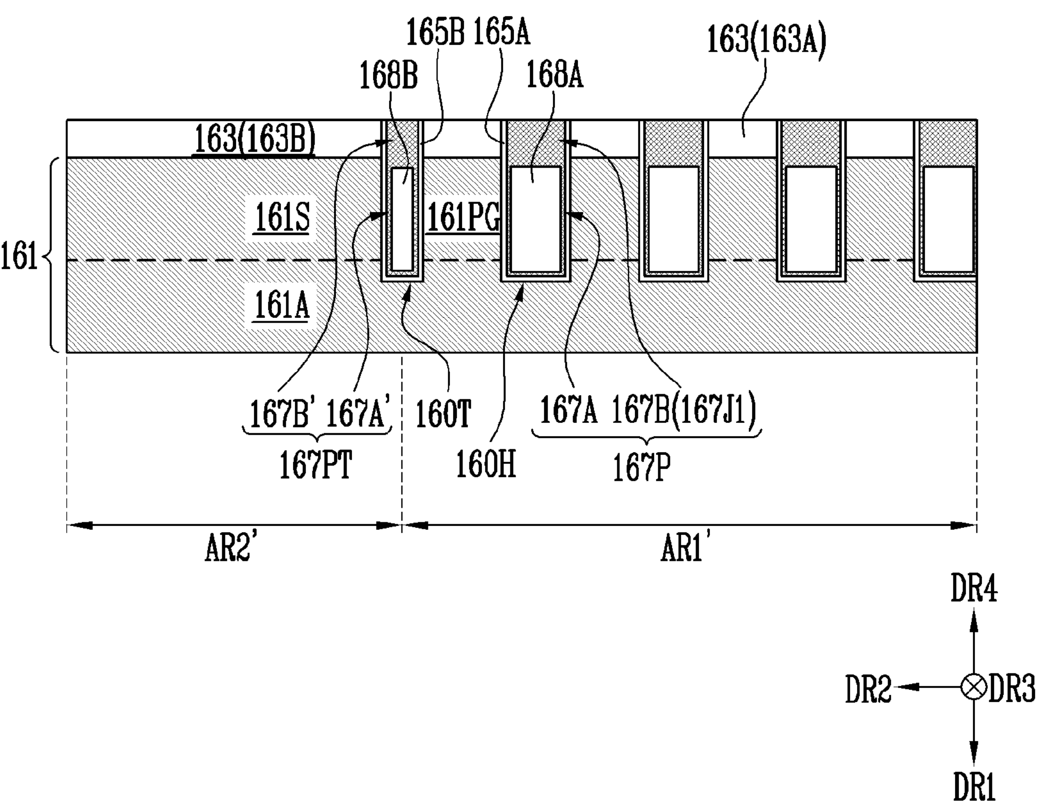

FIG. 8 illustrates a cross-section of the active pillar 167P and the partition wall structure 167PT taken along a line I-I' shown in FIG. 7C.

Referring to FIGS. 7C and 8, the insulating layer may be separated into the pass gate insulating layer 165A and the partition wall insulating layer 165B by the series of processes described with reference to FIG. 7C, and the channel layer may be separated into a first channel layer 167A of the active pillar 167P and a partition wall channel layer 167A' of the partition wall structure 167PT by the series of processes described with reference to FIG. 7C. In addition, the gap fill insulating layer may be separated into a first core insulating layer 168A surrounded by the first channel layer 167A and a partition wall core insulating layer 168B surrounded by the partition wall channel layer 167A' of the partition wall structure 167PT, and the doped semiconductor layer may be separated into a first capping pattern 167B of the active pillar 167P and a partition wall capping pattern 167B' of the partition wall structure 167PT.

The pass gate insulating layer 165A may extend along a surface of the active hole 160H. The active pillar 167P may be formed inside the active hole 160H opened by the pass gate insulating layer 165A. The active pillar 167P may include the first channel layer 167A and the first capping pattern 167B. The first capping pattern 167B may be used as a first junction 167J1 of the active pillar 167P. The first core insulating layer 168A and the first capping pattern 167B may be formed inside the active hole 160H opened by the first channel layer 167A.

The partition wall insulating layer 165B may extend along a surface of the trench 160T. The partition wall structure 167PT may be formed inside the trench 160T opened by the partition wall insulating layer 165B. The partition wall structure 167PT may include the partition wall channel layer 167A' and the partition wall capping pattern 167B'. The partition wall core insulating layer 168B and the partition wall capping pattern 167B' may be formed inside the trench 160T opened by the partition wall channel layer 167A'.

According to an embodiment of the present disclosure, a channel length of the pass transistor may be variously formed by controlling a depth of the active hole 160H. In addition, a channel width of the pass transistor may be variously formed by controlling an inner diameter of the active hole 160H.

FIGS. 9A to 9D are cross-sectional views illustrating an embodiment for subsequent processes after the process described with reference to FIGS. 7C and 8.

Figure 9A:
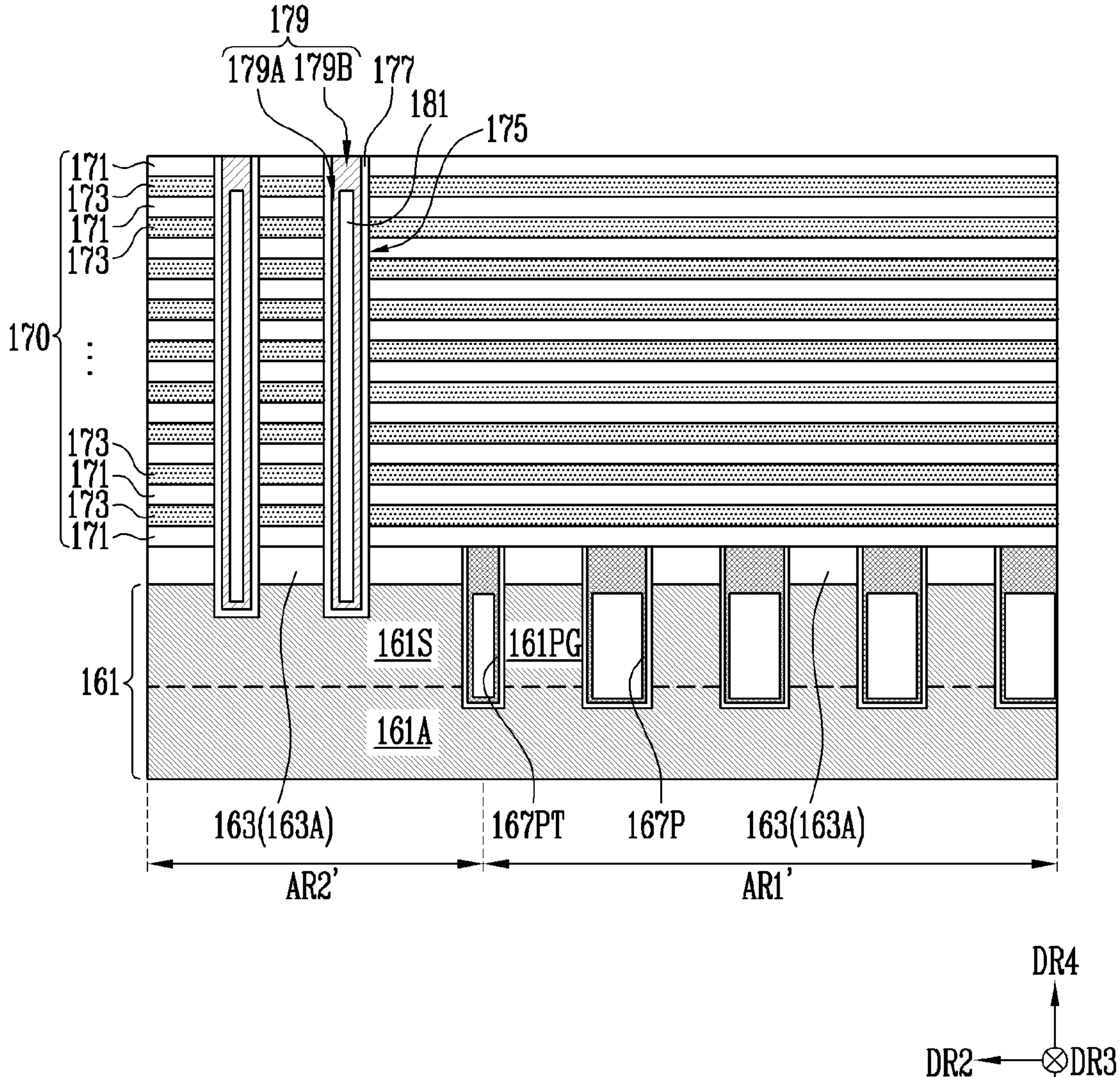

Referring to FIG. 9A, a preliminary stack 170 may be formed over the preliminary pass gate layer 161 including the active pillar 167P and the partition wall structure 167PT. The preliminary stack 170 may be formed by alternately stacking a plurality of first material layers 171 and a plurality of second material layers 173 over the interposition insulating layer 163 in the fourth direction DR4.

The plurality of second material layers 173 may be formed of a material having an etch selectivity with respect to the plurality of first material layers 171. As an embodiment, the plurality of first material layers 171 may include an insulating material such as a silicon oxide layer and a silicon oxynitride layer, and the plurality of second material layers 173 may include a sacrificial insulating material such as a silicon nitride layer.

Subsequently, the second region AR2' of the preliminary pass gate layer 161 may be exposed by etching a portion of each of the plurality of first material layers 171, the plurality of second material layers 173, and the first interposition portion 163A of the interposition insulating layer 163 overlapping the second region AR2' of the preliminary pass gate layer 161. Thereafter, the second region AR2' of the preliminary pass gate layer 161 may be etched. At this time, a portion of the semiconductor pattern 161S may be etched in the second region AR2' of the preliminary pass gate layer 161. Thus, a plurality of channel holes 175 may be formed. Each channel hole 175 may pass through the preliminary stack 170 and extend into the semiconductor pattern 161S disposed in the second region AR2' of the preliminary pass gate layer 161.

Thereafter, a memory layer 177 may be formed along a surface of each channel hole 175. As described with reference to FIGS. 3 to 5, the memory layer 177 may include the blocking insulating layer, the data storage layer, and the tunnel insulating layer. Subsequently, a channel pillar 179 may be formed in the channel hole 175 opened by the memory layer 177.

As an embodiment, forming the channel pillar 179 may include forming a second channel layer 179A by depositing a semiconductor material such as silicon or germanium on a surface of the memory layer 177, forming a second core insulating layer 181 in the channel hole 175 opened by the second channel layer 179A, opening a portion of the channel hole 175 by removing a portion of the second core insulating layer 181, and filling a portion of the opened channel hole 175 with a second capping pattern 179B. The second capping pattern 179B may include a doped semiconductor material.

Figure 9B:
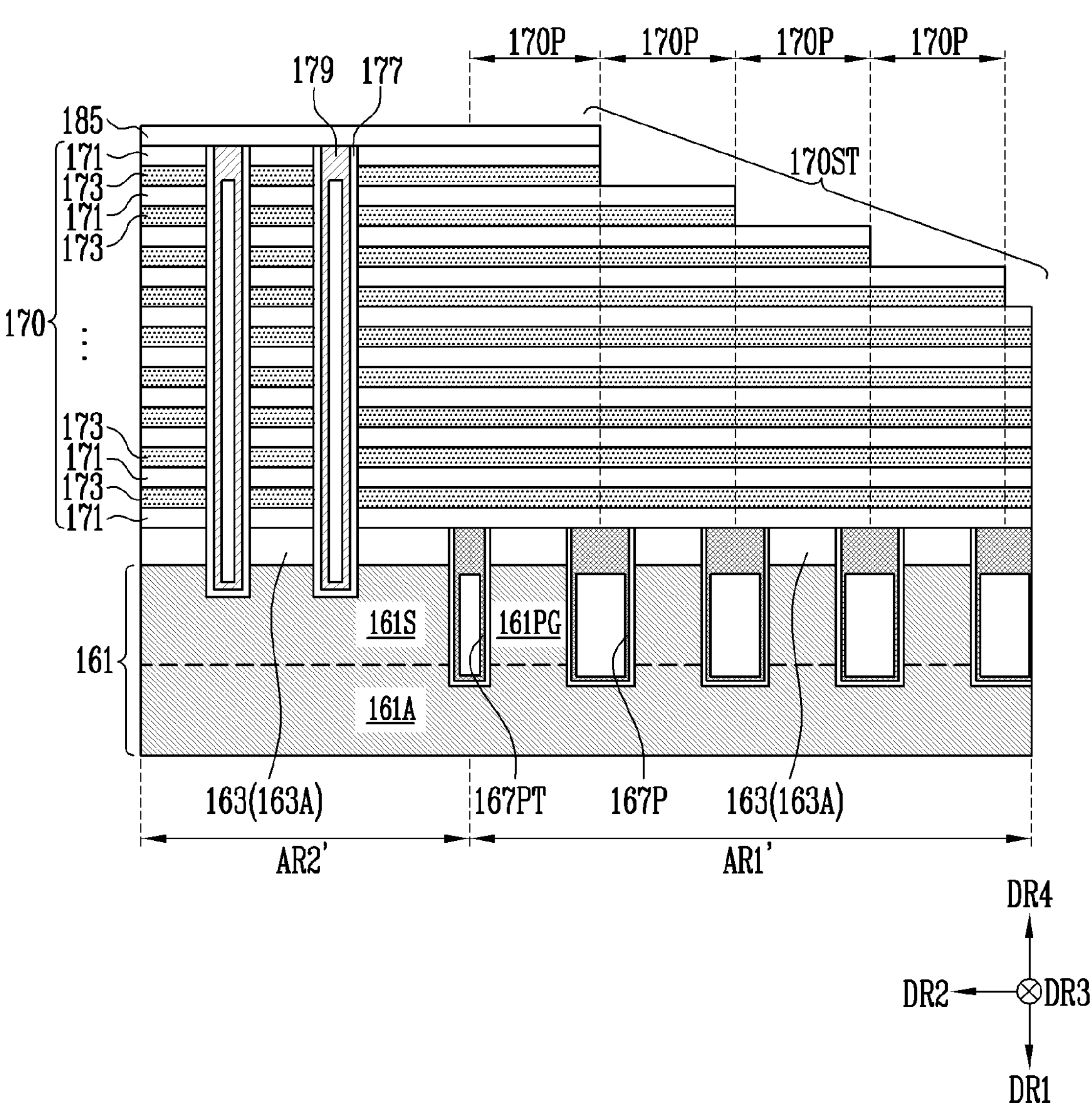

Referring to FIG. 9B, a buffer insulating layer 185 may be formed on the preliminary stack 170. The buffer insulating layer 185 may include an oxide such as a silicon oxide layer. Thereafter, an etching process for forming a stepped structure 170ST may be performed. Forming the stepped structure 170ST may include forming a mask layer (not shown) on the buffer insulating layer 185 and etching portions of the buffer insulating layer 185, the plurality of first material layers 171, and the plurality of second material layers 173, by an etching process using the mask layer as an etch barrier. At this time, the portions of the buffer insulating layer 185, the plurality of first material layers 171, and the plurality of second material layers 173 may be portions overlapping the first region AR1' of the preliminary pass gate layer 161. Etching a portion of the plurality of first material layers 171 and the plurality of second material layers 173 may include a trimming process of reducing a size of the mask layer and an etching process for an exposed region of the plurality of first material layers 171 and the plurality of second material layers 173. The trimming process and the etching process may be repeated until a plurality of pad portions 170P are formed. The mask layer may be removed after forming the stepped structure 170ST.

The plurality of pad portions 170P may be arranged at different heights and respectively overlap the plurality of active pillars 161P. Each of the plurality of pad portions 170P may be configured of a pair of a corresponding first material layer 171 and a corresponding second material layer 173. The plurality of pad portions 170P may correspond to a plurality of steps forming the stepped structure 170ST of the preliminary stack 170. A plurality of ends of the plurality of second material layers 173 forming the stepped structure 170ST may configure each of the plurality of pad portions 170P.

Figure 9C:
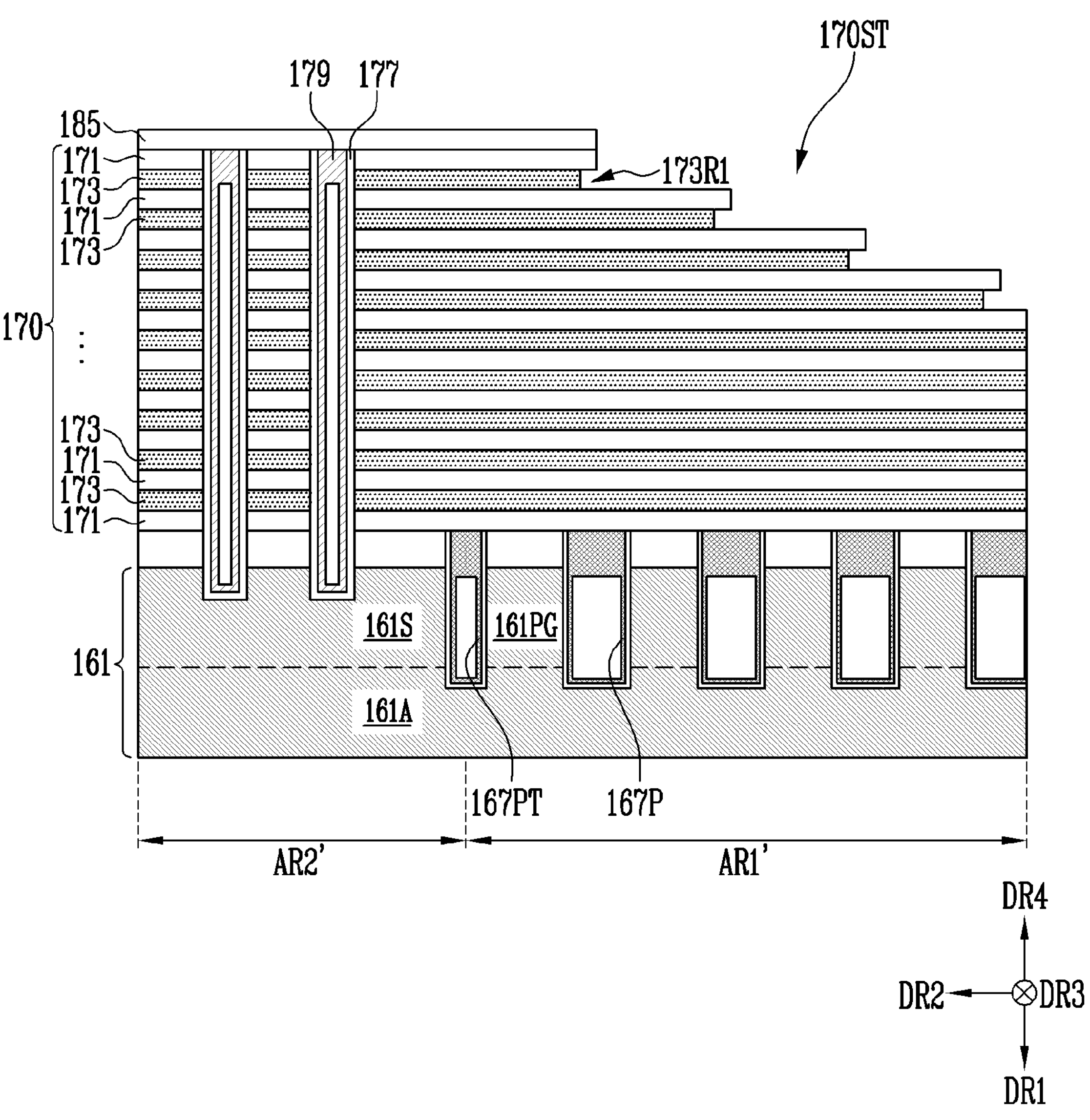

Referring to FIG. 9C, a plurality of first recess regions 173R1 may be formed by etching the plurality of ends of the plurality of second material layers 173 from an edge of the stepped structure 170ST in the preliminary stack 170. The plurality of first recess regions 173R1 may be defined between the plurality of first material layers 171 adjacent in the fourth direction DR4.

Figure 9D:
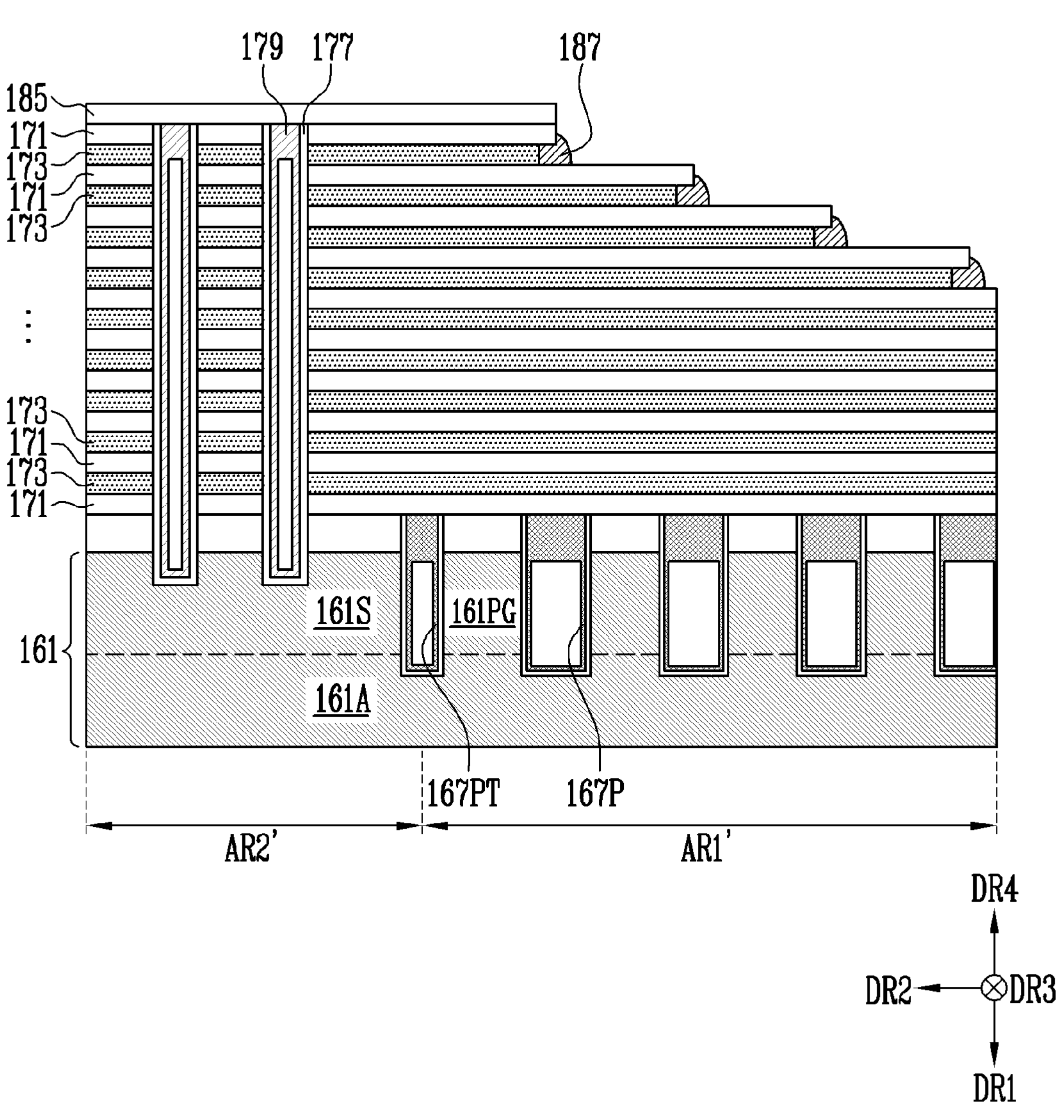

Referring to FIG. 9D, the plurality of first recess regions 173R1 shown in FIG. 9C may be filled with a plurality of third material layers 187. The plurality of third material layers 187 may include a material having an etch selectivity with respect to the plurality of first material layers 171 and the plurality of second material layers 173. As an embodiment, a process of forming the plurality of third material layers 187 may include forming a silicon layer to fill the plurality of first recess regions 173R1 shown in FIG. 9C and removing a portion of the silicon layer using an etching process such as etch-back so that the silicon layer is separated into the plurality of third material layers 187.

Figure 10A:
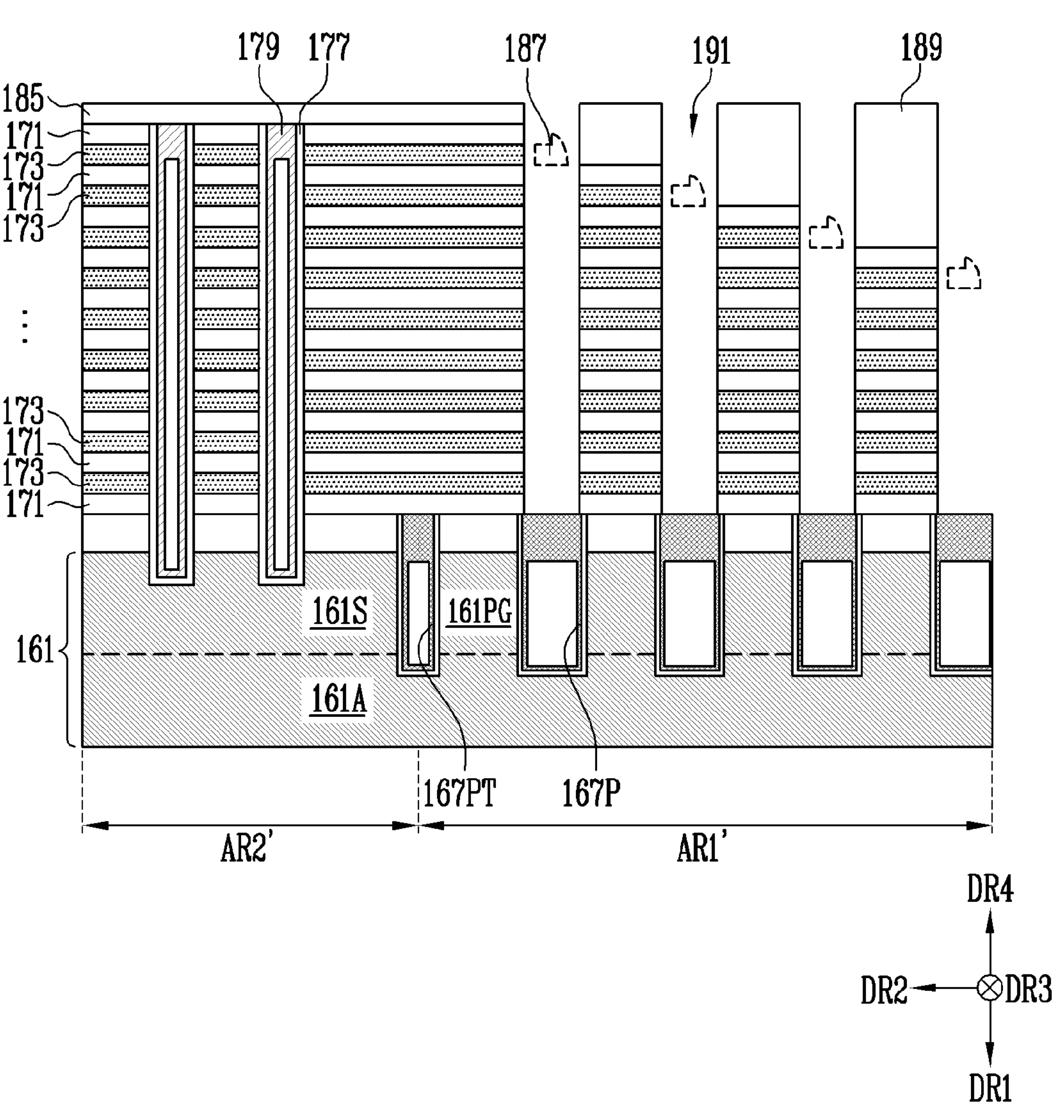
Figure 10B:
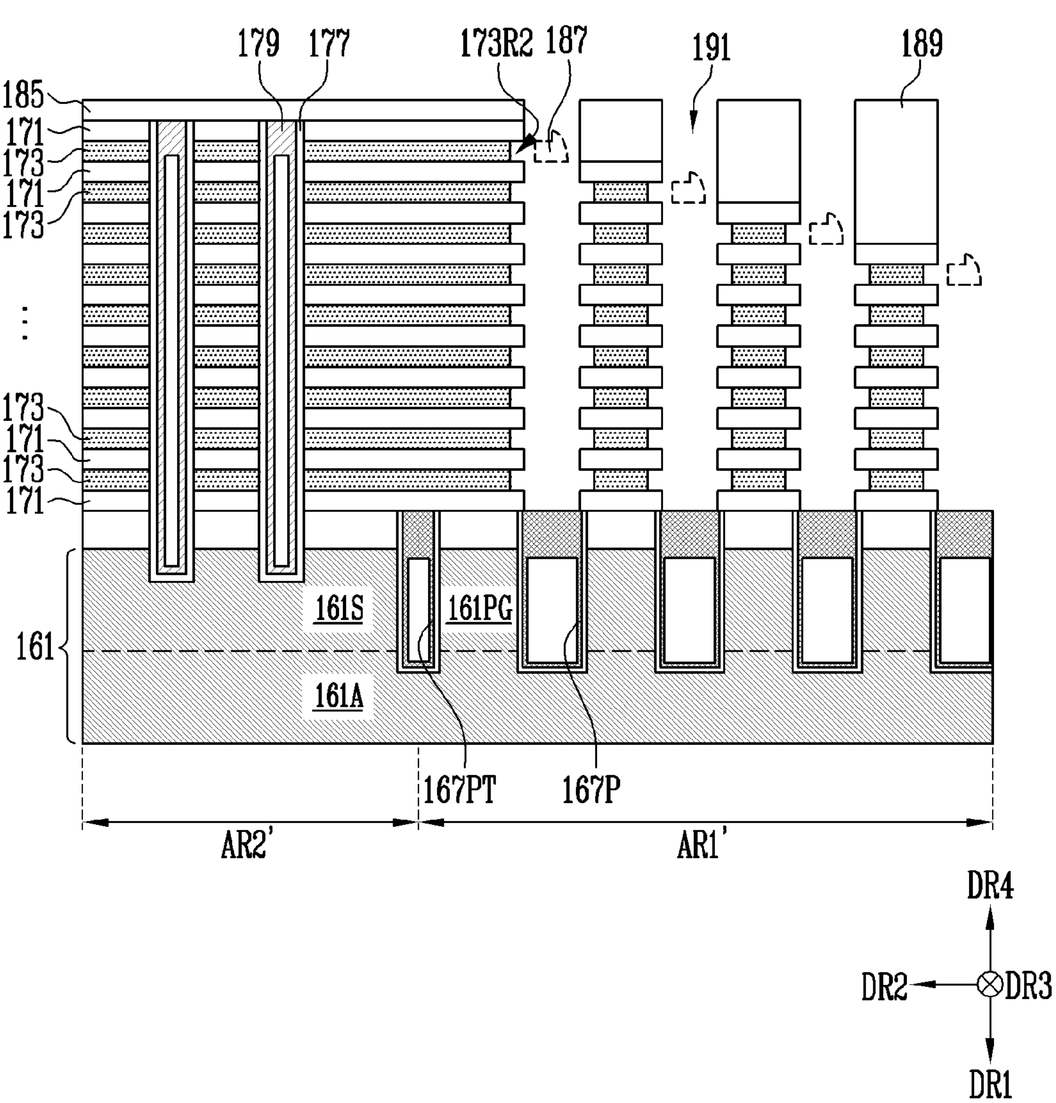

FIGS. 10A and 10B are cross-sectional views illustrating an embodiment for subsequent processes after the process described with reference to FIG. 9D.

Referring to FIG. 10A, a filling insulating layer 189 may be formed to cover the plurality of third material layers 187 and the plurality of pad portions 170P described with reference to FIG. 9B. The filling insulating layer 189 may include an oxide such as a silicon oxide layer.

Subsequently, a portion of each of the filling insulating layer 189, the plurality of first material layers 171, the plurality of second material layers 173, and the plurality of third material layers 187 overlapping the plurality of active pillars 167P may be etched. Thus, a plurality of contact holes 191 may be formed to expose the plurality of active pillars 167P, respectively.

Referring to FIG. 10B, a portion of each of the plurality of second material layers 173 may be etched through the plurality of contact holes 191. Thus, a plurality of second recess regions 173R2 may be defined. Each of the plurality of second recess regions 173R2 may be defined between the first material layers 171 adjacent in the fourth direction DR4.

Figure 11A:
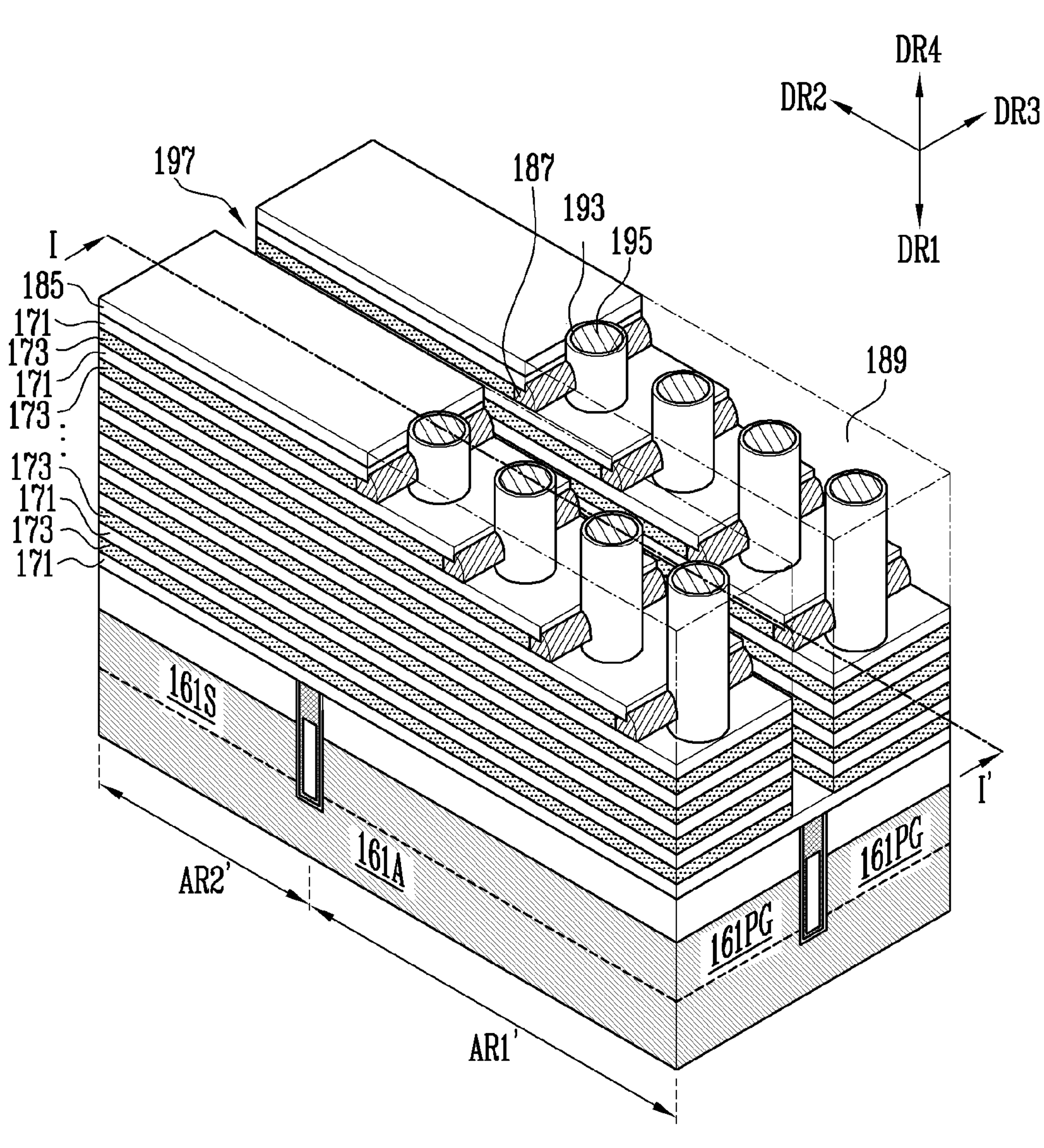
Figure 11B:
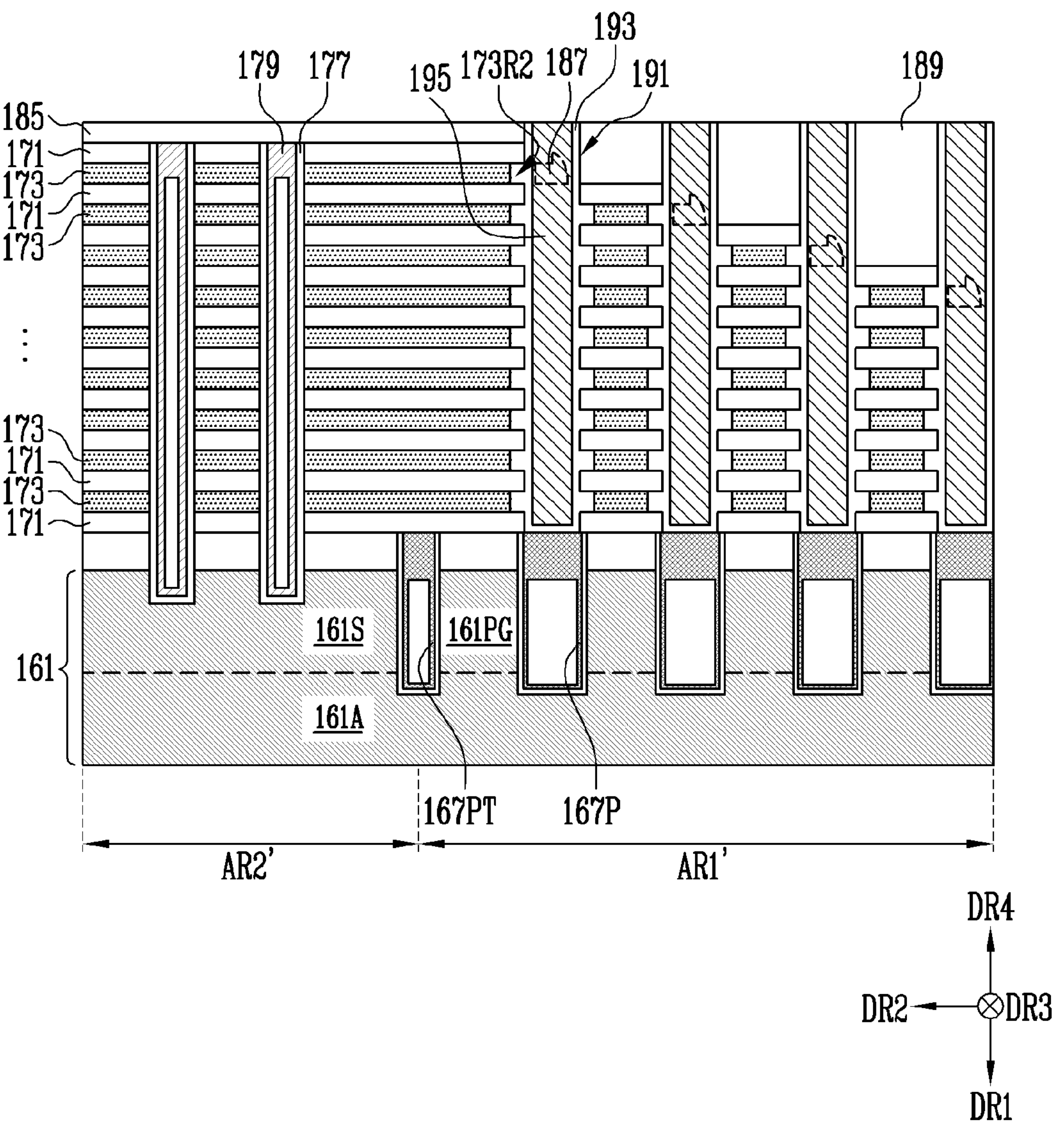

FIGS. 11A and 11B are perspective and cross-sectional views illustrating an embodiment for subsequent processes after the process described with reference to FIG. 10B. FIG. 11A is a perspective view illustrating the filling insulating layer 189 for convenience of recognition for the stepped structure, and FIG. 11B is a cross-sectional view taken along a line I-I' shown in FIG. 11A.

Referring to FIGS. 11A and 11B, a spacer layer 193 may be formed inside each of the plurality of contact holes 191 to fill the plurality of second recess regions 173R2. The spacer layer 193 may include an insulating material having an etch selectivity with respect to the plurality of second material layers 173 and the plurality of third material layers 187. As an embodiment, the spacer layer 193 may include an oxide such as a silicon oxide layer.

The spacer layer 193 may extend along a surface of each of the plurality of contact holes 191. A central region of each of the plurality of contact holes 191 may be opened without being filled with the spacer layer 193.

Thereafter, the central region of each of the plurality of contact holes 191 opened by the spacer layer 193 may be filled with a fourth material layer 195. The fourth material layer 195 may include a material having an etch selectivity with respect to the spacer layer 193. As an embodiment, the fourth material layer 195 may include silicon. The spacer layer 193 may be interposed between each third material layer 187 and the fourth material layer 195 corresponding thereto.

Subsequently, a slit 197 may be formed by etching the buffer insulating layer 185, the filling insulating layer 189, the plurality of first material layers 171, the plurality of second material layers 173, and the plurality of third material layers 187. The slit 197 may extend in the second direction DR2. A side of each of the plurality of second material layers 173 and the plurality of third material layers 187 may be exposed by the slit 197.

FIGS. 12A to 12K are cross-sectional views illustrating an embodiment for subsequent processes after forming the slit 197 shown in FIG. 11A.

Figure 12A:
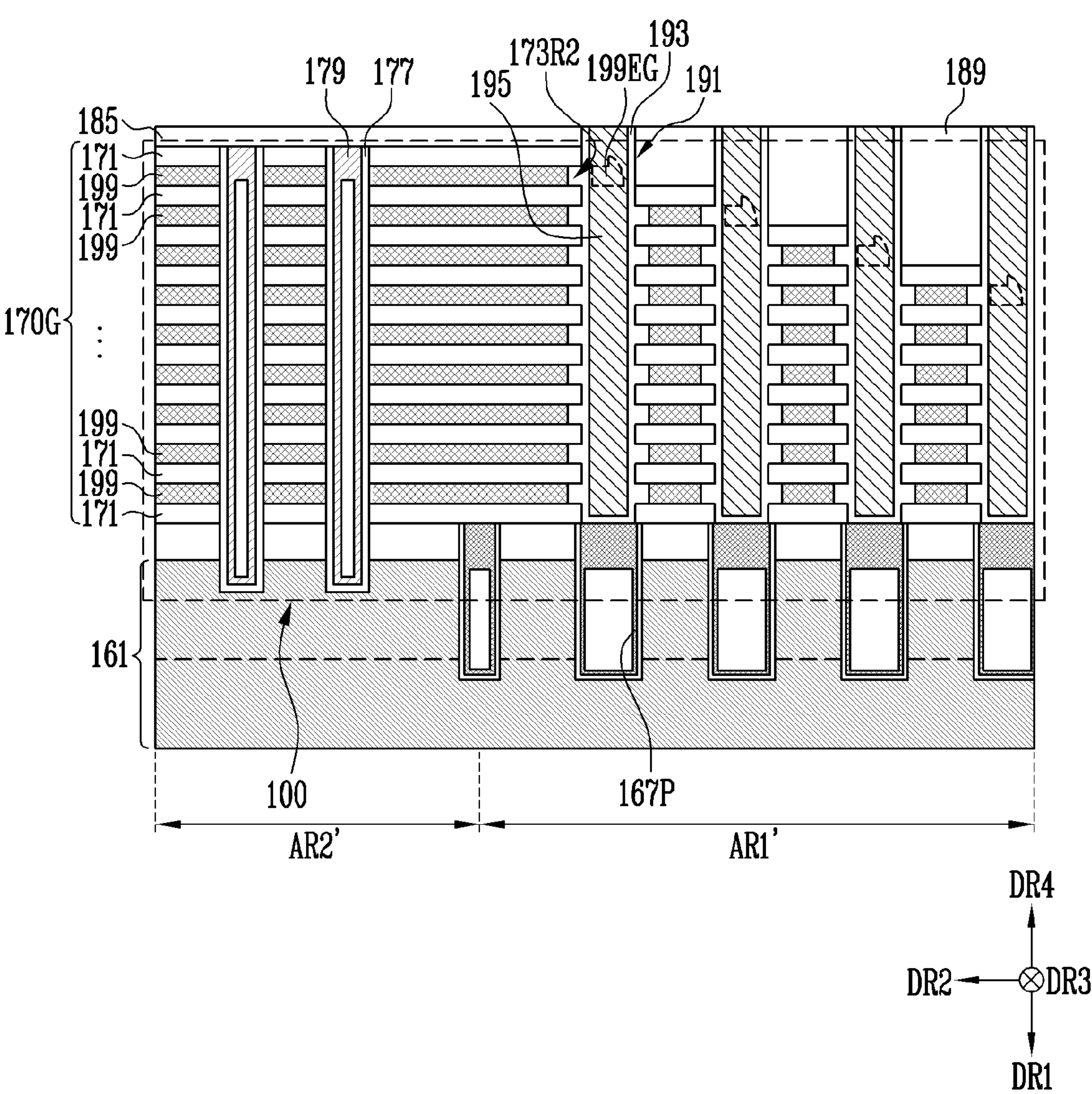

Referring to FIG. 12A, the plurality of second material layers 173 and the plurality of third material layers 187 shown in FIGS. 11A and 11B may be replaced with a plurality of conductive patterns 199 through the slit 197 shown in FIG. 11A. More specifically, the plurality of second material layers 173 and the plurality of third material layers 187 shown in FIGS. 11A and 11B may be selectively removed through the slit 197 shown in FIG. 11A. At this time, even though the fourth material layer 195 is formed of the same material as the third material layer 187 shown in FIG. 11B, the fourth material layer 195 may be protected by the spacer layer 193 and may serves as a support. Subsequently, a conductive material may be formed in a region where the plurality of second material layers 173 and the plurality of third material layers 187 are removed. Thereafter, a portion of the conductive material inside the slit 197 shown in FIG. 11A may be removed so that the conductive material is separated into the plurality of conductive patterns 199. Although not shown in the figure, before forming the conductive material, a metal oxide layer such as an aluminum oxide layer may be formed along a surface of the region where the plurality of second material layers 173 and the plurality of third material layers 187 are removed.

As described above, a gate stack 170G may be defined by replacing the plurality of second material layers 173 and the plurality of third material layers 187 with the plurality of conductive patterns 199. In addition, the memory cell array 100 including the gate stack 170G, the memory layer 177, and the channel pillar 179 may be formed.

The gate stack 170G may include the plurality of first material layers 171 and the plurality of conductive patterns 199. Each of the plurality of first material layers 171 may be used as an interlayer insulating layer. Each of the plurality of first material layers 171 and the plurality of conductive patterns 199 of the gate stack 170G may overlap the second region AR2' of the preliminary pass gate layer 161, and may be penetrated by the memory layer 177 and the channel pillar 179. The plurality of conductive patterns 199 of the gate stack 170G may be spaced apart from each other by the plurality of first material layers 171. The plurality of conductive patterns 199 may include a plurality of ends 199EG respectively overlapping the plurality of active pillars 167P. The plurality of ends 199EG of the plurality of conductive patterns 199 may form a stepped structure. Each of the plurality of ends 199EG of the plurality of conductive patterns 199 may be spaced apart from the fourth material layer 195 by the spacer layer 193 corresponding thereto.

Although not shown in the figure, after forming the memory cell array 100, a vertical structure may be formed inside the slit 197 shown in FIG. 11A. The vertical structure may include an insulating material or may include an insulating material and a conductive material.

Figure 12B:
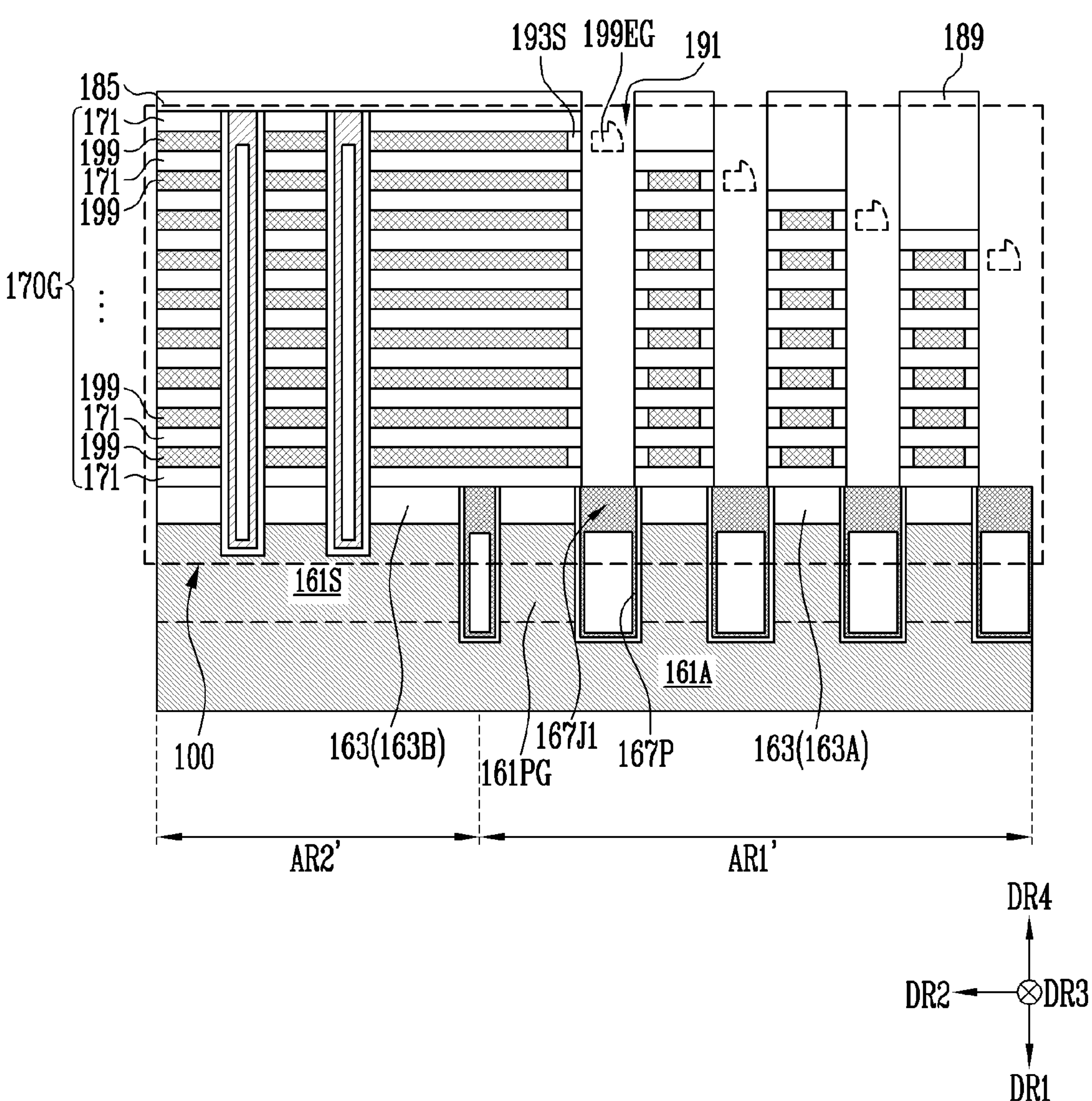

Referring to FIG. 12B, the plurality of contact holes 191 may be opened by etching the fourth material layer 195 and the spacer layer 193 shown in FIG. 12A. Although not shown in the figure, when a metal oxide layer is additionally formed before forming the plurality of conductive patterns 199, a portion of the metal oxide layer may be exposed by the etching process of the spacer layer 193 shown in FIG. 12A, and the exposed portion of the metal oxide layer may be additionally etched.

According to the above-described process, the plurality of ends 199EG of the plurality of conductive patterns 199 may be exposed by the plurality of contact holes 191. An exposed region of each of the plurality of ends 199EG of the plurality of conductive patterns 199 may form the first inner sidewall IW1 as described with reference to FIG. 6B.

The etching process of the spacer layer 193 shown in FIG. 12A may be controlled so that a portion of the spacer layer remains as an insulating spacer 193S. The insulating spacer 193S may be disposed inside each of the second recess regions 173R2 shown in FIG. 12A. The etching process of the spacer layer 193 shown in FIG. 12A may be controlled so that the plurality of active pillars 167P are respectively exposed through the plurality of contact holes 191. At this time, the first junction 167J1 of the active pillar 167P corresponding each contact hole 191 may be exposed through each contact hole 191.

Figure 12C:
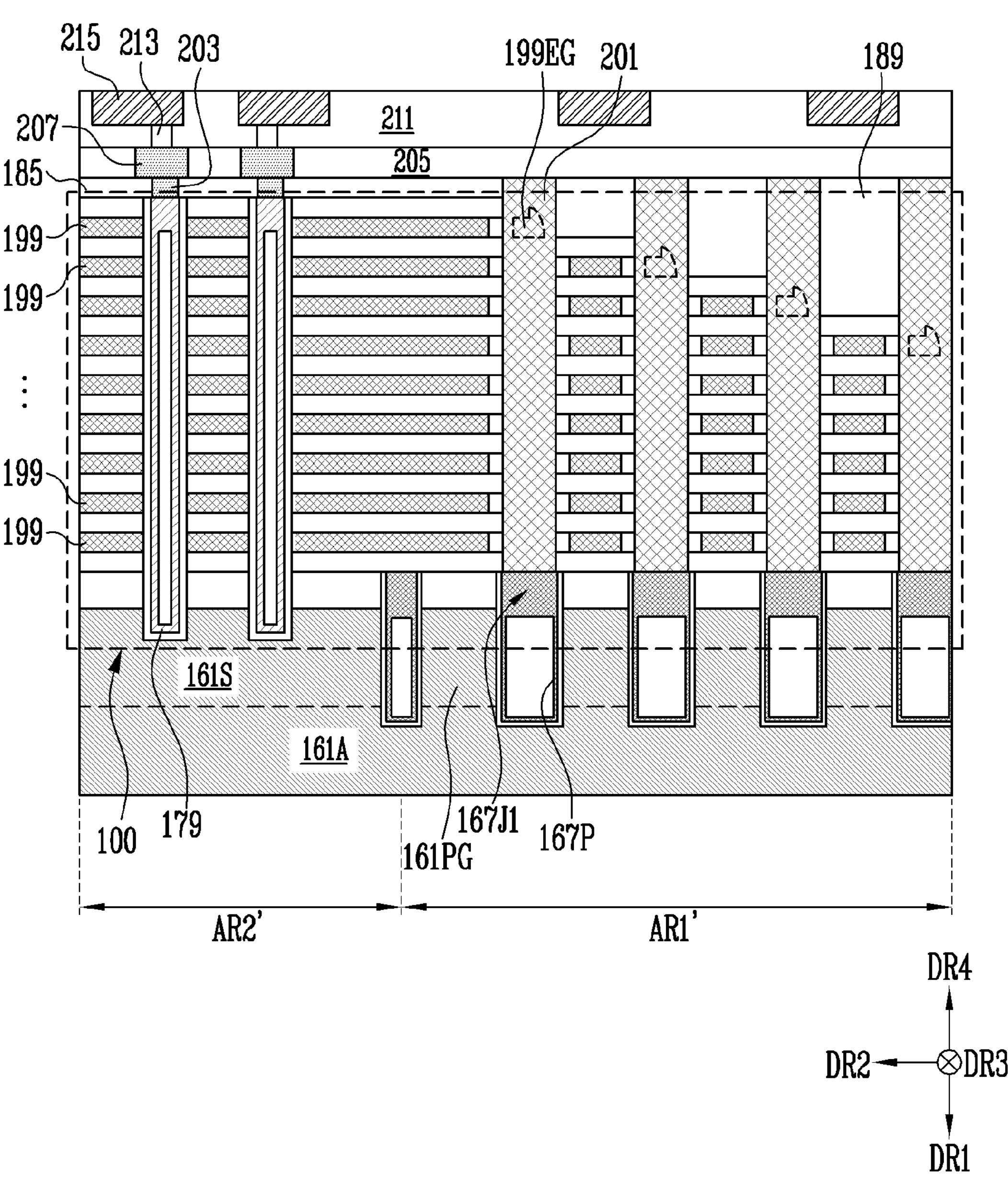

Referring to FIG. 12C, a plurality of gate contact plugs 201 may be formed by filling the plurality of contact holes 191 shown in FIG. 12B with a conductive material. Each gate contact plug 201 may contact an exposed region of the end 199EG of the conductive pattern 199 corresponding thereto. Each gate contact plug 201 may contact the first junction 167J1 of the active pillar 167P corresponding thereto. Accordingly, the plurality of gate contact plugs 201 may connect the plurality of conductive patterns 199 of the memory cell array 100 to the plurality of active pillars 167P.

Thereafter, a bit line contact 203, a bit line 207, a first conductive bonding contact 213, and a first conductive bonding pattern 215 may be formed on the memory cell array 100.

As an embodiment, the bit line contact 203 may be formed in the buffer insulating layer 185. The bit line contact 203 may pass through the buffer insulating layer 185 to contact the channel pillar 179 of the memory cell array 100. Thereafter, an insulating layer 205 may be formed to cover the bit line contact 203, the plurality of gate contact plugs 201, the buffer insulating layer 185, and the filling insulating layer 189. Subsequently, the bit line 207 may be formed in the insulating layer 205. The bit line 207 may pass through the insulating layer 205 to contact the bit line contact 203. Subsequently, a first insulating structure 211 in which the first conductive bonding contact 213 and the first conductive bonding pattern 215 are buried may be formed.

Figure 12D:
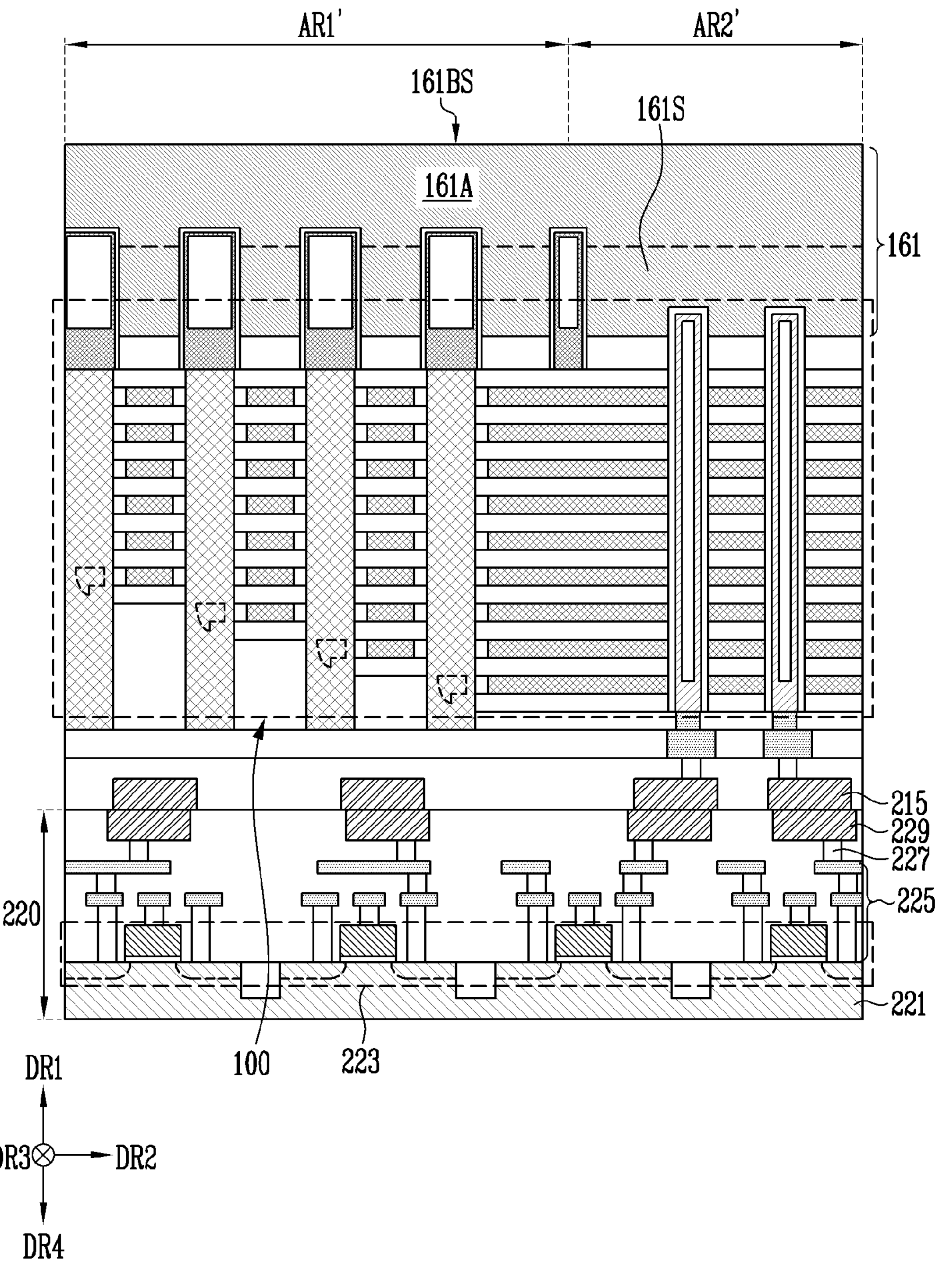

Referring to FIG. 12D, a structure 220 corresponding to the second structure ST2 described with reference to FIG. 3 may be provided. The structure 220 may include a semiconductor layer 221, a peripheral circuit structure 223, a plurality of interconnections 225, a plurality of second conductive bonding contacts 227, and a plurality of second conductive bonding patterns 229 identically to that described with reference to FIG. 3.

Subsequently, a bonding process may be performed so that the plurality of second conductive bonding patterns 229 of the structure 220 are connected to the plurality of first conductive bonding patterns 215.

Figure 12E:
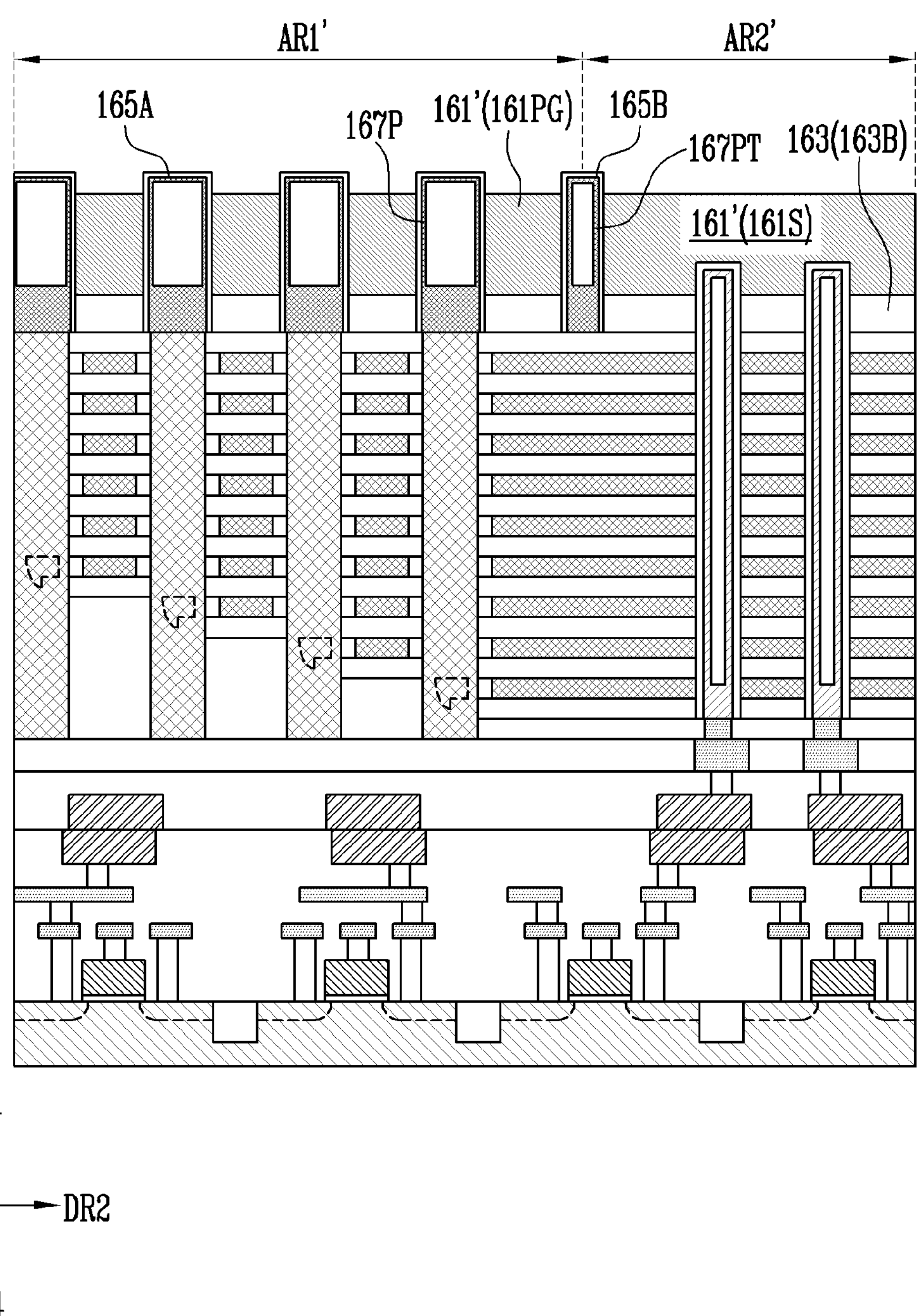

Referring to FIG. 12E, the seed region 161A of the preliminary pass gate layer 161 shown in FIG. 12D may be removed from a rear surface 161BS of the preliminary pass gate layer 161 shown in FIG. 12D. At this time, the seed region 161A of the preliminary pass gate layer 161 shown in FIG. 12D may be selectively etched through a wet etching process.

As the seed region 161A of the preliminary pass gate layer 161 shown in FIG. 12D is removed, a preliminary pass gate layer 161' of which a thickness is reduced may remain. In addition, the pass gate insulating layer 165A and the partition wall insulating layer 165B may be exposed. The preliminary pass gate layer 161' of which the thickness is reduced may be separated into the semiconductor pattern 161S and the pass gate 161PG with the partition wall structure 167PT interposed therebetween. The pass gate 161PG may be configured as a portion of the preliminary pass gate layer 161' remaining in the first region AR1', and may surround the plurality of active pillars 167P. The semiconductor pattern 161S may be configured as a portion of the preliminary pass gate layer 161' remaining in the second region AR2'.

Figure 12F:
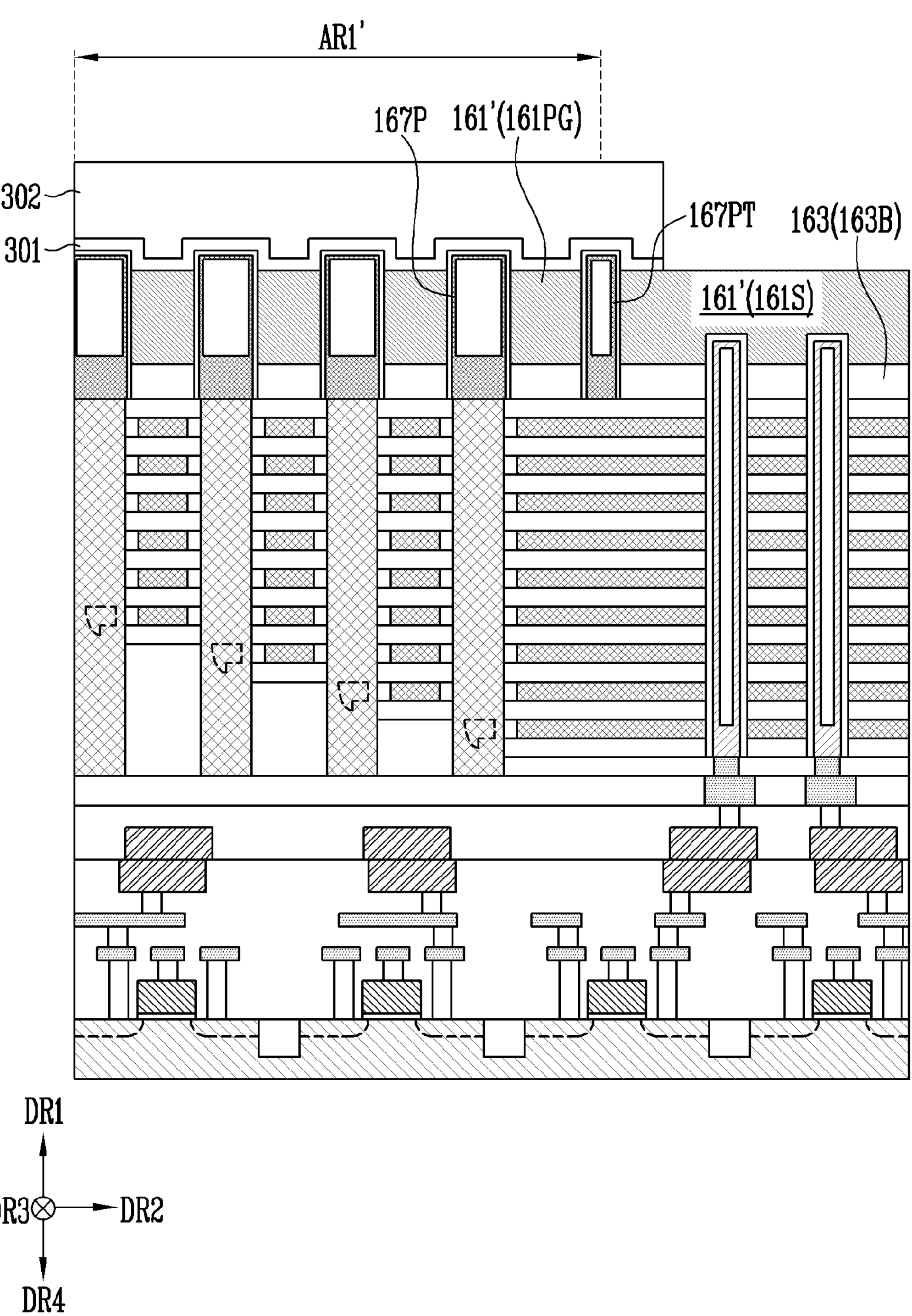

Referring to FIG. 12F, a first upper insulating layer 301 may be formed over the preliminary pass gate layer 161'. Subsequently, a second mask pattern 302 may be formed over the first upper insulating layer 301. The second mask pattern 302 may overlap the plurality of active pillars 167P and the pass gate 161PG and might not overlap the second region AR2' of the preliminary pass gate layer 161'. Thereafter, the second region AR2' of the preliminary pass gate layer 161' may be exposed by etching a portion of the first upper insulating layer 301 by an etching process using the second mask pattern 302 as an etch barrier.

Figure 12G:
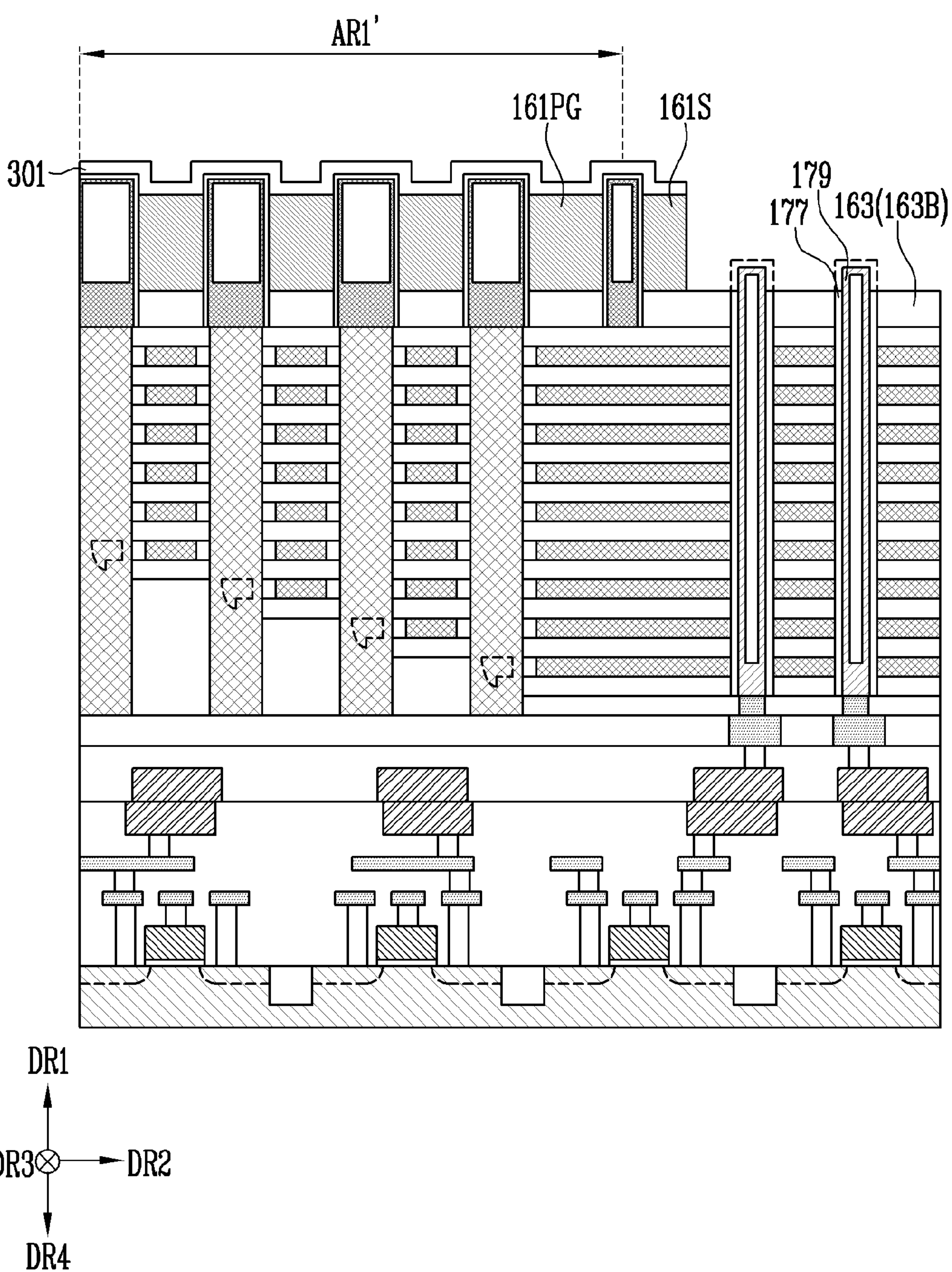

Subsequently, a portion of the second region AR2' of the preliminary pass gate layer 161' of FIG. 12F exposed by the first upper insulating layer 301 may be etched. Thus, as shown in FIG. 12G, the second interposition portion 163B of the interposition insulating layer 163 may be exposed, and as indicated by a dotted line of FIG. 12G, a portion of the memory layer 177 may be exposed. Thereafter, the second mask pattern 302 may be removed. The first region AR1' of the preliminary pass gate layer 161' may remain as the pass gate 161PG, and a portion of the second region AR2' of the preliminary pass gate layer 161' adjacent to the partition wall structure 167PT may remain as the semiconductor pattern 161S.

Referring to FIG. 12G, the portion of the memory layer 177 indicated by the dotted line may be removed. Thus, a portion of the channel pillar 179 may be exposed.

Figure 12H:
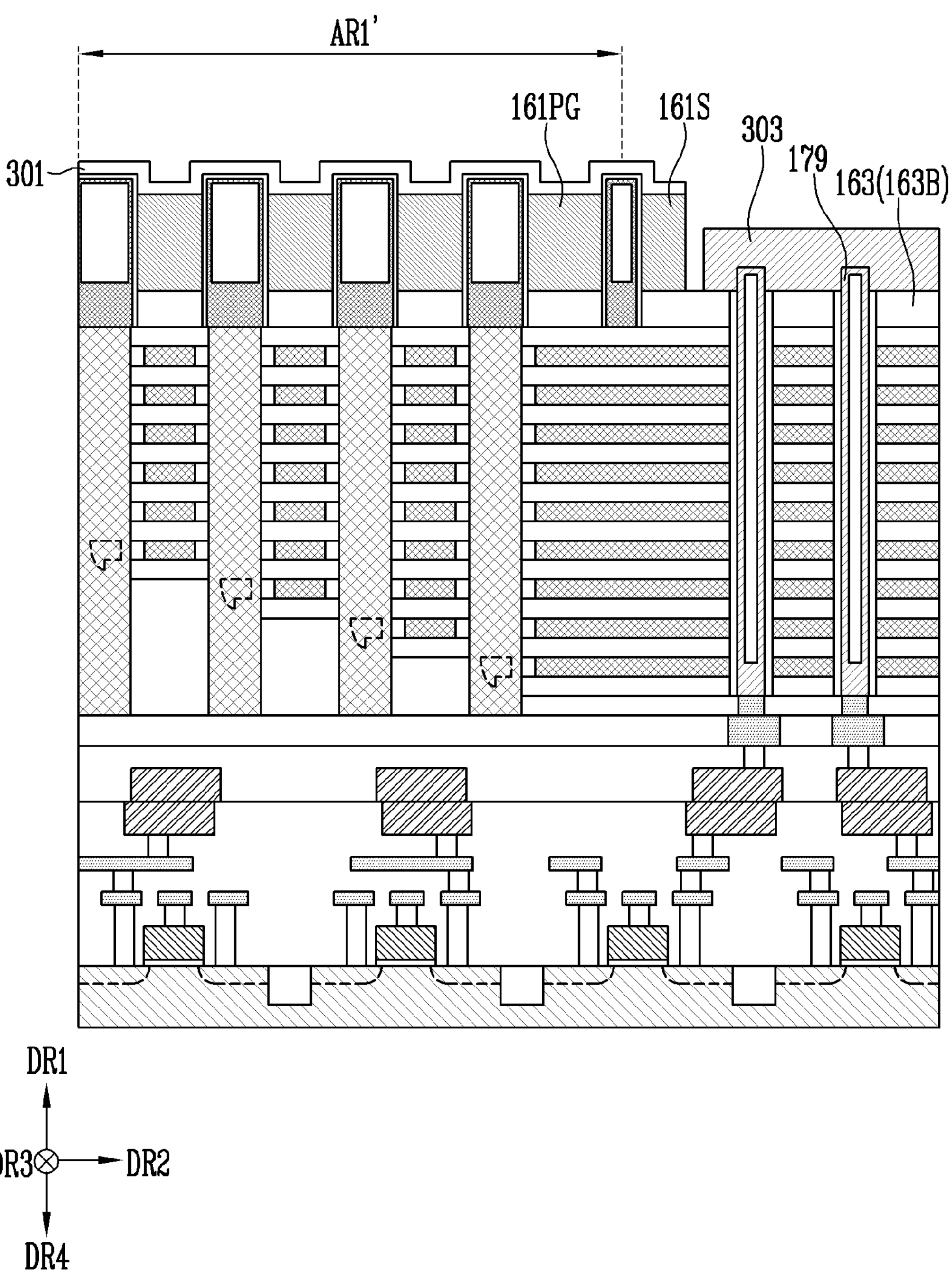

Referring to FIG. 12H, a doped semiconductor layer 303 connected to the channel pillar 179 may be formed. The doped semiconductor layer 303 may include at least one of an n-type impurity and a p-type impurity. As an embodiment, the doped semiconductor layer 303 may include an n-type impurity as a majority carrier.

The doped semiconductor layer 303 may be formed in a region where the second region AR2' of the preliminary pass gate layer 161' described with reference to FIGS. 12F and 12G is etched. Accordingly, the doped semiconductor layer 303 may overlap a sidewall of the pass gate 161PG. Meanwhile, the doped semiconductor layer 303 may be spaced apart from the semiconductor pattern 161S in the second direction DR2.

The doped semiconductor layer 303 may be formed over the second interposition portion 163B of the interposition insulating layer 163 to cover an exposed region of the channel pillar 179. The doped semiconductor layer 303 may contact the exposed region of the channel pillar 179.

Figure 12I:
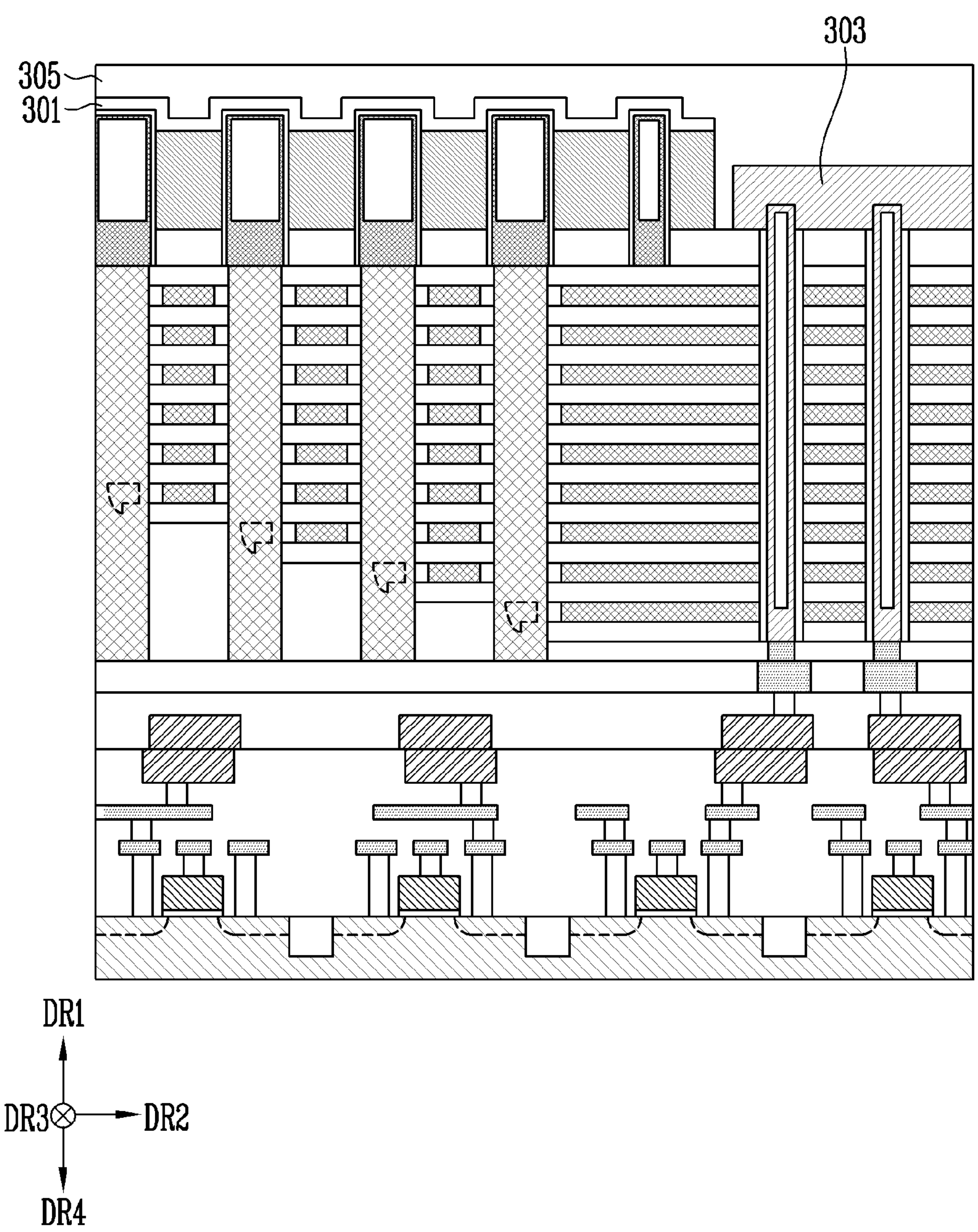

Referring to FIG. 12I, a second upper insulating layer 305 may be formed to cover the doped semiconductor layer 303 and the first upper insulating layer 301. The second upper insulating layer 305 may fill a region between the semiconductor pattern 161S and the doped semiconductor layer 303.

Figure 12J:
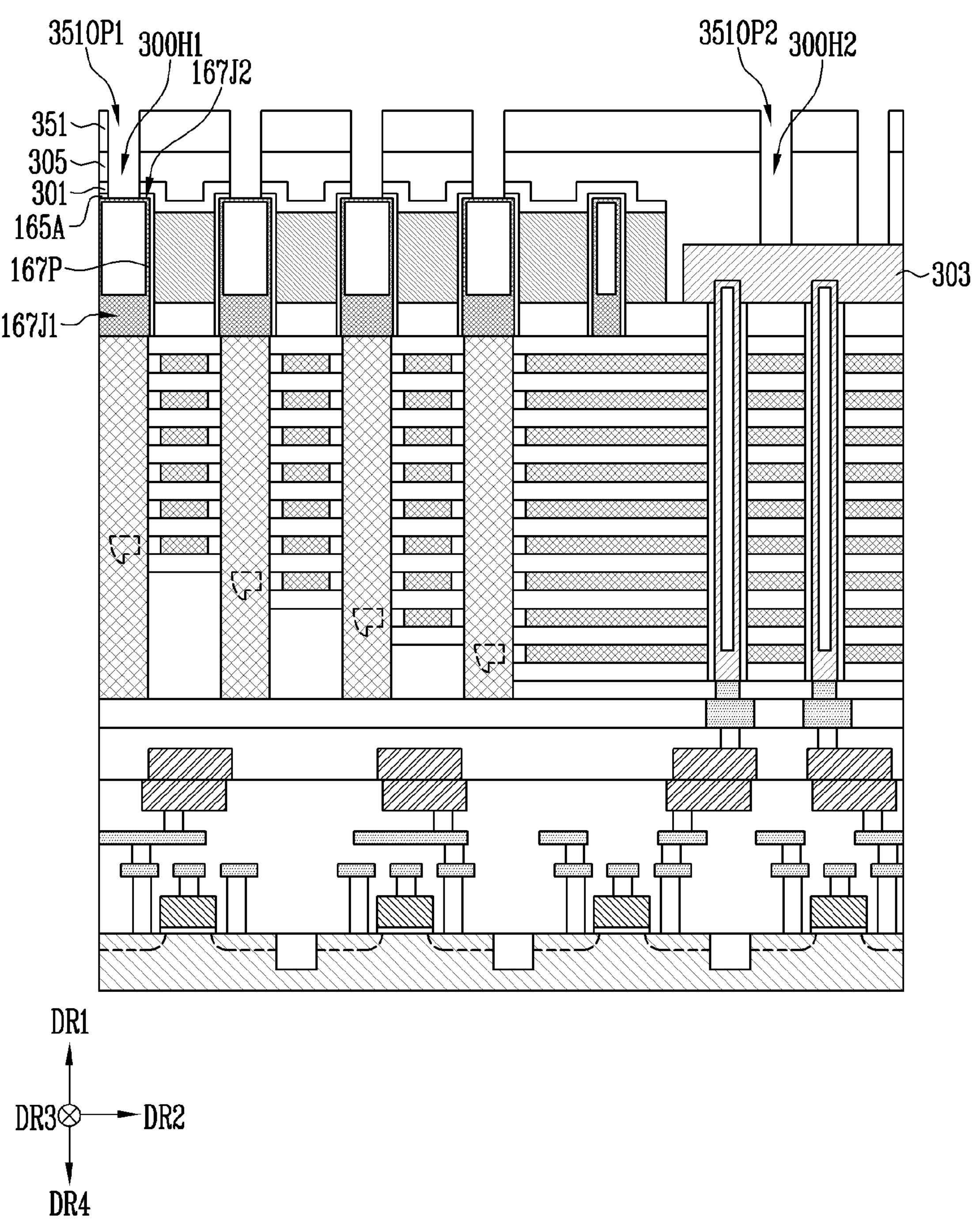

Referring to FIG. 12J, a third mask pattern 351 may be formed over the first upper insulating layer 301 and the second upper insulating layer 305. The third mask pattern 351 may include a plurality of openings 3510P1 and 3510P2. The plurality of openings 3510P1 and 3510P2 may include a plurality of first openings 351OP1 and a second opening 3510P2. The plurality of first openings 3510P1 may respectively overlap the plurality of active pillars 167P. The second opening 3510P2 may overlap the doped semiconductor layer 303.

Subsequently, a portion of each of the first upper insulating layer 301, the second upper insulating layer 305, and the pass gate insulating layer 165A may be etched by an etching process using the third mask pattern 351 as an etch barrier. Thus, a plurality of upper holes 300H1 and 300H2 may be formed. The plurality of upper holes 300H1 and 300H2 may include a plurality of first upper holes 300H1 and a second upper hole 300H2. The plurality of first upper holes 300H1 may expose each of the plurality of active pillars 167P by passing through the first upper insulating layer 301, the second upper insulating layer 305, and the pass gate insulating layer 165A. The second upper hole 300H2 may expose the doped semiconductor layer 303 by passing through the second upper insulating layer 305.

Subsequently, a second junction 167J2 may be formed by injecting at least one of an n-type impurity and a p-type impurity into a portion of the plurality of active pillars 167P through the plurality of first upper holes 300H1. A region between the first junction 167J1 and the second junction 167J2 may be used as a channel region in each active pillar 167P.

Thereafter, the mask pattern 351 may be removed.

Figure 12K:
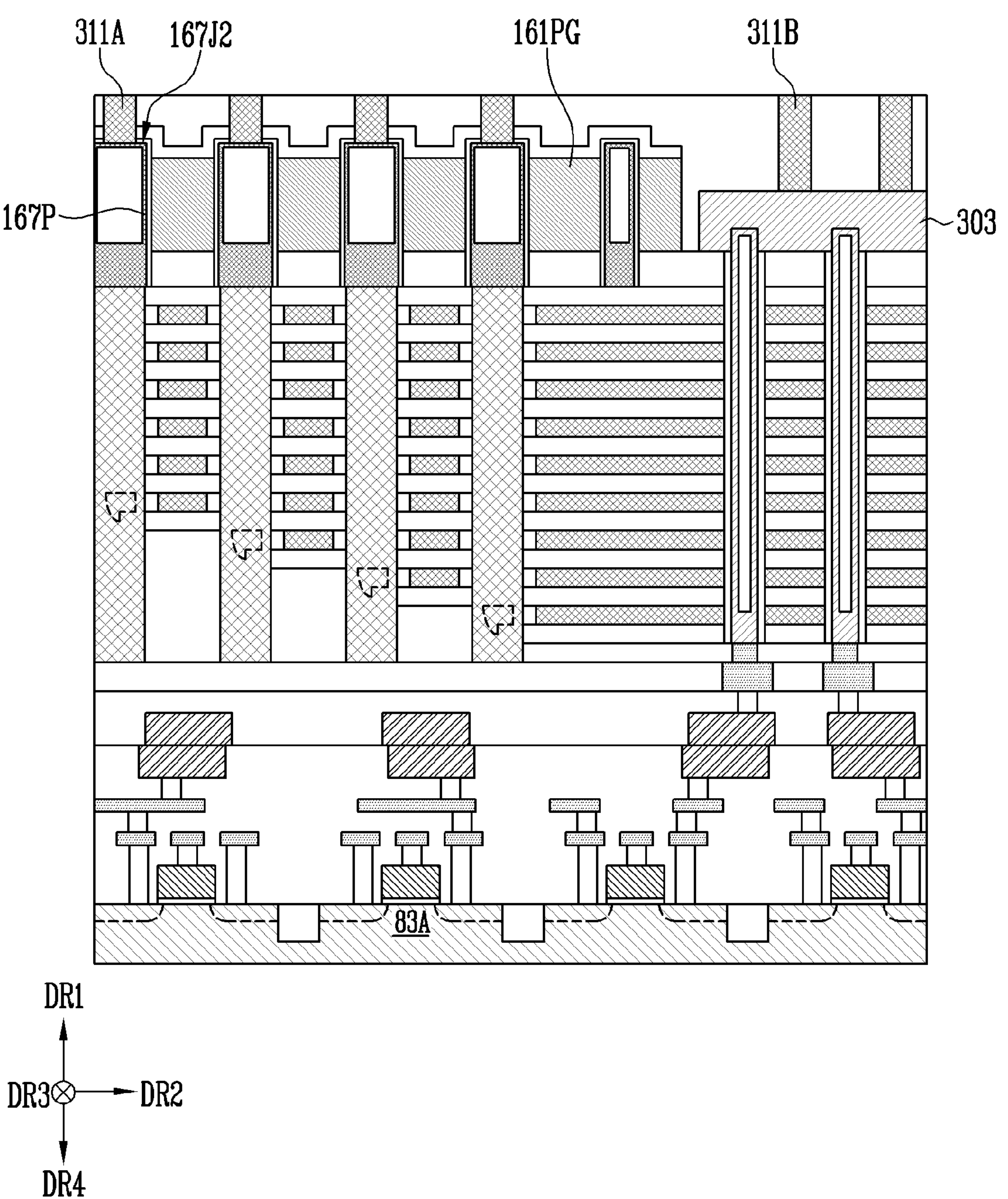

Referring to FIG. 12K, a plurality of contacts 311A and 311B may be formed by filling the plurality of upper holes 300H1 and 300H2 with a conductive material. The plurality of contacts 311A and 311B may include a plurality of first contacts 311A and a second contact 311B.

The plurality of first contacts 311A may be respectively disposed inside the plurality of first upper holes 300H1 shown in FIG. 12J. Each first contact 311A may contact the second junction 167J2 of the active pillar 167P corresponding thereto. The second contact 311B may be disposed inside the second upper hole 300H2 shown in FIG. 12J and may contact the doped semiconductor layer 303.

Thereafter, a subsequent process of forming the plurality of upper lines UL1 and UL2 shown in FIG. 3 may be performed.

Figure 13:
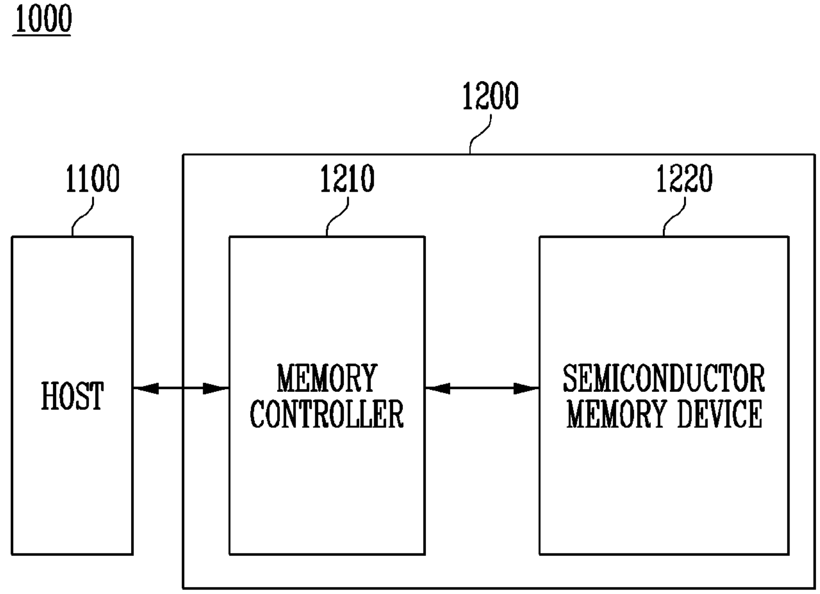
FIG. 13 is a block diagram illustrating an electronic system including a semiconductor memory device according to an embodiment of the present disclosure.

FIG. 13 is a block diagram illustrating an electronic system 1000 including a semiconductor memory device 1220 according to an embodiment of the present disclosure.

Referring to FIG. 13, the electronic system 1000 may be a computing system, a medical device, a communication device, a wearable device, a memory system, and the like. The electronic system 1000 may include a host 1100 and a storage device 1200.

The host 1100 may store data in the storage device 1200 or read data stored in the storage device 1200 based on an interface. The interface may include at least one of a double data rate (DDR) interface, a universal serial bus (USB) interface, a multimedia card (MMC) interface, an embedded MMC (eMMC) interface, a peripheral component interconnection (PCI) interface, a PCI-express (PCI-E) interface, an advanced technology attachment (ATA) interface, a serial-ATA interface, a parallel-ATA interface, a small computer system interface (SCSI), an enhanced small disk interface (ESDI), integrated drive electronics (IDE) interface, a Firewire interface, a universal flash storage (UFS) interface, and a nonvolatile memory express (NVMe) interface.

The storage device 1200 may include a memory controller 1210 and the semiconductor memory device 1220. As an embodiment, the storage device 1200 may be a storage medium such as a solid state drive (SSD) or a USB memory.

The memory controller 1210 may store data in the semiconductor memory device 1220 or read data stored in the semiconductor memory device 1220 under control of the host 1100.

The semiconductor memory device 1220 may include The one memory chip or a plurality of memory chips. semiconductor memory device 1220 may store data or output stored data under control of the memory controller 1210.

The semiconductor memory device 1220 may be a nonvolatile memory device. As described with reference to FIG. 3, the semiconductor memory device 1220 may include a pass gate and a doped semiconductor layer overlapping a gate stack. According to an embodiment of the present disclosure, a pass gate may overlap a portion of a gate stack and a doped semiconductor layer may overlap another portion of the gate stack. Thus, it is possible to improve an integration degree of the semiconductor memory device.

What is claimed is:

1. A semiconductor memory device comprising:

a gate stack including a plurality of conductive patterns spaced apart from each other in a first direction and stacked in the first direction, the gate stack including a contact region and a cell array region extending from the contact region in a second direction crossing the first direction;

a pass gate overlapping the contact region of the gate stack and opening the cell array region of the gate stack;

a doped semiconductor layer spaced apart from the pass gate in the second direction and overlapping the cell array region of the gate stack; and a plurality of active pillars passing through the pass gate.

2. The semiconductor memory device of claim 1, wherein a side of the pass gate includes a region overlapping a side of the doped semiconductor layer.

3. The semiconductor memory device of claim 1, further comprising:

a channel pillar including a first portion extending in the first direction and passing through the cell array region of the gate stack, and a second portion extending from the first portion and embedded in the doped semiconductor layer; and a memory layer between the first portion of the channel pillar and the gate stack.

4. The semiconductor memory device of claim 3, wherein a side of the pass gate includes a region overlapping the second portion of the channel pillar.

5. The semiconductor memory device of claim 1, further comprising:

a peripheral circuit structure overlapping the pass gate with the gate stack interposed between the peripheral circuit structure and the pass gate.

6. The semiconductor memory device of claim 1, further comprising:

a plurality of gate contact plugs passing through the contact region of the gate stack and respectively contacting the plurality of active pillars, wherein each gate contact plug of the plurality of gate contact plugs includes a contact surface contacting a corresponding conductive pattern among the plurality of conductive patterns.

7. The semiconductor memory device of claim 6, further comprising:

a plurality of insulating spacers interposed between adjacent gate contact plugs and conductive patterns among the plurality of gate contact plugs and the plurality of conductive patterns, wherein the plurality of insulating spacers comprises:

a first insulating spacer adjacent to the contact surface of each gate contact plug of the plurality of gate contact plugs; and a second insulating spacer spaced apart from the contact surface of each gate contact plug of the plurality of gate contact plugs and formed in an annular shape to surround a side of each gate contact plug of the plurality of gate contact plugs.

8. The semiconductor memory device of claim 1, further comprising:

a pass gate insulating layer disposed between each active pillar of the plurality of active pillars and the pass gate.

9. The semiconductor memory device of claim 1, wherein each active pillar of the plurality of active pillars comprises:

a first junction facing the gate stack;

a second junction facing a direction opposite to that of the first junction; and a channel region between the first junction and the second junction.

10. The semiconductor memory device of claim 1, further comprising:

a semiconductor pattern disposed between the doped semiconductor layer and the pass gate, the semiconductor pattern overlapping the gate stack;

a partition wall structure disposed between the semiconductor pattern and the pass gate; and a partition wall insulating layer surrounding a side of the partition wall structure.

11. The semiconductor memory device of claim 10, wherein the semiconductor pattern includes the same material as the pass gate, and wherein the partition wall structure includes the same material as the plurality of active pillars.

12. The semiconductor memory device of claim 1, wherein a plurality of ends of the plurality of conductive patterns respectively overlap the plurality of active pillars and form a stepped structure in the contact region of the gate stack.

13. A semiconductor memory device comprising:

a peripheral circuit structure including a first region and a second region;

a pass gate spaced apart from the peripheral circuit structure in a first direction and overlapping the first region of the peripheral circuit structure;

doped semiconductor layer spaced apart from the peripheral circuit structure in the first direction and spaced apart from the pass gate in a second direction crossing the first direction;

a gate stack including a contact region between the peripheral circuit structure and the pass gate and a cell array region extending from the contact region to a region between the peripheral circuit structure and the doped semiconductor layer;

an active pillar passing through the pass gate;

a pass gate insulating layer between the pass gate and the active pillar;

a channel pillar contacting the doped semiconductor layer and passing through the cell array region of the gate stack;

a memory layer between the channel pillar and the gate stack; and a gate contact plug connected to the active pillar and passing through the contact region of the gate stack.

14. The semiconductor memory device of claim 13, wherein the gate stack includes a plurality of conductive patterns spaced apart from each other in the first direction and stacked in the first direction, and wherein the plurality of conductive patterns includes a first conductive pattern contacting the gate contact plug and a second conductive pattern insulated from the gate contact plug.

15. The semiconductor memory device of claim 14, further comprising:

a first insulating spacer interposed between the gate contact plug and the first conductive pattern and opening a contact surface between the gate contact plug and the first conductive pattern; and a second insulating spacer interposed between the gate contact plug and the second conductive pattern and formed in an annular shape to surround a side of the gate contact plug.

16. The semiconductor memory device of claim 13, wherein the active pillar comprises:

a first junction contacting the gate contact plug;

a second junction facing a direction opposite to that of the first junction; and a channel region between the first junction and the second junction.

17. The semiconductor memory device of claim 13, further comprising:

at least one upper insulating layer covering the pass gate and the doped semiconductor layer;

a global line and a common source line over the at least one upper insulating layer;

a first contact passing through the at least one upper insulating layer to connect the active pillar to the global line; and a second contact passing through the at least one upper insulating layer to connect the doped semiconductor layer to the common source line.

18. The semiconductor memory device of claim 13, further comprising:

an interposition insulating layer including a first interposition portion between the gate stack and the pass gate and a second interposition portion between the gate stack and the doped semiconductor layer, wherein the active pillar and the channel pillar extend to pass through the interposition insulating layer.

19. The semiconductor memory device of claim 13, further comprising:

a semiconductor pattern disposed between the doped semiconductor layer and the pass gate, the semiconductor pattern overlapping the gate stack;

a partition wall structure disposed between the semiconductor pattern and the pass gate; and a partition wall insulating layer surrounding a side of the partition wall structure.

* * * * *